United States Patent
Hamann et al.

(10) Patent No.: US 11,933,962 B2
(45) Date of Patent: Mar. 19, 2024

(54) MEMS BASED SPATIAL LIGHT MODULATORS AND APPLICATIONS

(71) Applicant: SILICON LIGHT MACHINES CORPORATION, San Jose, CA (US)

(72) Inventors: Stephen Hamann, Mountain View, CA (US); Alexander Payne, Ben Lommond, CA (US); Lars Eng, Los Altos, CA (US); James Hunter, Campbell, CA (US); Tianbo Liu, San Jose, CA (US); Gregory Jacob, Santa Clara, CA (US)

(73) Assignee: SILICON LIGHT MACHINES CORPORATION

( * ) Notice: Subject to any disclaimer, the term of this patent is extended or adjusted under 35 U.S.C. 154(b) by 0 days.

(21) Appl. No.: 17/591,898

(22) Filed: Feb. 3, 2022

(65) Prior Publication Data
US 2022/0252862 A1    Aug. 11, 2022

Related U.S. Application Data

(60) Provisional application No. 63/146,488, filed on Feb. 5, 2021.

(51) Int. Cl.
| | | |
|---|---|---|
| G02B 26/00 | (2006.01) | |
| G02B 26/02 | (2006.01) | |
| G02B 26/08 | (2006.01) | |
| G03F 7/00 | (2006.01) | |

(52) U.S. Cl.
CPC ......... *G02B 26/001* (2013.01); *G02B 26/023* (2013.01); *G02B 26/0808* (2013.01); *G02B 26/0841* (2013.01); *G03F 7/70191* (2013.01)

(58) Field of Classification Search
CPC ............... G02B 26/001; G02B 26/023; G02B 26/0808; G02B 26/0841; G03F 7/70191; G03F 7/70291
See application file for complete search history.

(56) References Cited

U.S. PATENT DOCUMENTS

| | | |
|---|---|---|
| 5,459,610 A | 10/1995 | Bloom et al. |
| 7,061,591 B2 * | 6/2006 | Bleeker ............... G03F 7/70291 430/311 |
| 7,064,883 B2 | 6/2006 | Payne et al. |
| 7,227,687 B1 | 6/2007 | Trisnadi et al. |

(Continued)

*Primary Examiner* — Hung V Nguyen
(74) *Attorney, Agent, or Firm* — William Nuttle

(57) ABSTRACT

Spatial light modulators (SLMs) and systems using same are described. Generally, the system includes a laser, a fixture holding a workpiece to be processed using the laser, illumination optics to illuminate the SLM with laser light, imaging optics to focus modulated light from the SLM onto the workpiece, and a controller to control the laser, the SLM, imaging optics and the fixture to scan the modulated light across a workpiece surface. The SLM includes an array of microelectromechanical system based diffractors, each including an electrostatically deflectable member coupled to a first light reflective surface and to bring light reflected from the first light reflective surface into interference with light reflected from a second light reflective surface in the SLM. The controller is operable to provide analog gray-scale control of an intensity of modulated light reflected from each diffractor by controlling an electrostatic force generated by a driver coupled thereto.

19 Claims, 15 Drawing Sheets

(56) References Cited

U.S. PATENT DOCUMENTS

| | | | |
|---|---|---|---|
| 7,277,110 B2 | 10/2007 | Zarem et al. | |
| 7,842,935 B2 * | 11/2010 | Aloni | G03F 7/70275 |
| | | | 250/492.23 |
| 8,767,170 B2 | 7/2014 | Sano et al. | |
| 10,665,182 B1 * | 5/2020 | Payne | G09G 3/3433 |
| 11,016,287 B2 * | 5/2021 | Payne | G02B 26/0808 |
| 11,067,953 B2 * | 7/2021 | Dürr | G03H 1/02 |
| 2016/0085067 A1 | 3/2016 | Payne et al. | |

* cited by examiner

| UV | 300-400nm | n | k | Lambda (nm) | Thk (nm) | Pairs | Reflectance % | Thickness Å |
|---|---|---|---|---|---|---|---|---|
| SiO2 | Silicon dioxide | 1.470 | 0 | 350 | 60 | - | | |
| Si3N4 | Silicon nitride | 2.112 | 0 | 350 | 41 | 5.5 | 94.2 | 5460 |
| ZrO2 | Zirconium oxide | 2.354 | 0 | 350 | 37 | 3.5 | 95.5 | 3280 |
| SiC | Silicon carbide | 2.856 | 0.113 | 350 | 31 | 3.5 | 87.9 | 3040 |

| VIS | 400-700nm | n | k | Lambda (nm) | Thk (nm) | Pairs | Reflectance % | Thickness Å |
|---|---|---|---|---|---|---|---|---|
| SiO2 | Silicon dioxide | 1.455 | 0 | 550 | 95 | - | | |
| SiN | Silicon nitride | 2.041 | 0 | 550 | 67 | 4.5 | 93.2 | 7150 |
| SiC | Silicon carbide | 2.673 | 0.0073 | 550 | 51 | 2.5 | 95.0 | 3430 |
| TiO2 | Titanium dioxide | 2.994 | 0 | 550 | 46 | 2.5 | 97.4 | 3280 |
| AlAs | Aluminum arsenide | 3.336 | 0.0077 | 550 | 41 | 2.5 | 98.5 | 3130 |

| NIR | 700-1000nm | n | k | Lambda (nm) | Thk (nm) | Pairs | Reflectance % | Thickness Å |
|---|---|---|---|---|---|---|---|---|
| SiO2 | Silicon dioxide | 1.456 | 0 | 850 | 146 | - | | |
| TiO2 | Titanium dioxide | 2.784 | 0 | 850 | 76 | 2.5 | 96.2 | 5200 |
| AlAs | Aluminum arsenide | 2.960 | 0 | 850 | 72 | 2.5 | 97.6 | 5080 |
| SiPoly | Polysilicon | 4.089 | 0.0169 | 850 | 52 | 2.5 | 99.4 | 2500 |

FIG. 5C

MEMS BASED SPATIAL LIGHT MODULATORS AND APPLICATIONS

CROSS-REFERENCE TO RELATED APPLICATIONS

This application claims the benefit of priority under 35 U.S.C. 119(e) to U.S. Provisional Patent Application Ser. No. 63/146,488, filed Feb. 5, 2021, which is incorporated by reference herein in its entirety.

TECHNICAL FIELD

The present invention relates generally to microelectromechanical systems (MEMS) based devices, and more particularly to MEMS based spatial light modulators (SLMs) and to various systems including the same.

BACKGROUND

Spatial light modulators or SLMs include an array of one or more devices that can control or modulate an incident beam of light in a spatial pattern that corresponds to an electrical input to the devices. The incident light beam, typically generated by a laser, can be modulated in intensity, phase, polarization or direction. Spatial light modulators are increasingly being developed for use in various applications, including display systems, optical information processing and data storage, printing, maskless lithography, 3D printing, additive manufacturing, surface modification and optical phase modulators.

One type of spatial light modulator (SLM) potentially useful in the aforementioned applications is a microelectromechanical systems (MEMS) based SLM including an array of dynamically adjustable reflective surfaces or mirrors mounted over a substrate. Existing MEMS based SLMs include digital micromirror devices (DMDs), commercially available from Texas Instruments, and liquid crystal modulators. In operation electromagnetic radiation or light from a coherent light source, such as a laser, is projected onto the array, an alignment of the mirrors is altered by electronic signals generating electrostatic forces to displace at least some of the mirrors to modulate the phase, intensity and or angle of light reflected from the array.

Unfortunately, existing MEMS based SLMs have a number of problems or shortcomings that limit or prohibit their use in many applications. First, conventional MEMS based SLMs cannot handle the high power lasers employed in laser processing systems for applications including cutting, marking, engraving, and 3D printing. Typically, the failure mode of these devices when exposed to high power or temperature lasers is the "Soret effect" in which atoms of a reflective metal, such as aluminum, covering reflective surfaces in the MEMS based SLM physically migrate along from a hotter to a cooler region of the ribbon. This migration of metal atoms can reduce the reflection and hence the efficiency of the SLM, and ultimately shortens useful device life.

A second problem with MEMS based SLMs is their inability to provide fast beam steering and large scan angles necessary for many phase modulator applications. Fast beam steering requires the deflected mirrors to respond rapidly to a changing drive signal and to settle quickly and with minimal ringing or oscillation. The steering angle of a MEMS based SLM is limited by the amount by which the mirrors can be moved while substantially preventing pull-in or snap-down of the deflected mirror to the substrate.

Accordingly, there is a need for MEMS based SLM with high-power handling capabilities, rapid response fast beam steering and large steering angles. There is a further need for systems incorporating such a device.

SUMMARY

A micro-electromechanical system (MEMS) based spatial light modulator (SLM) and systems and applications using same are described. Generally, the system includes a laser, a fixture holding a workpiece to be processed using the laser, illumination optics to illuminate the SLM with laser light, imaging optics to focus modulated light from the SLM onto the workpiece, and a controller to control the laser, the SLM, imaging optics and the fixture to scan the modulated light across a workpiece surface. The SLM includes an array of microelectromechanical system based diffractors, each including an electrostatically deflectable member coupled to a first light reflective surface and to bring light reflected from the first light reflective surface into interference with light reflected from a second light reflective surface in the SLM. Because the electrostatically deflectable members are low mass and high tension members suspended over a surface of a substrate on which the SLM is formed, they are operable to provide high speed switching between a reflecting and non-reflecting state of less than about 300 ns.

Preferably, the controller is operable to provide analog gray-scale control of an intensity of modulated light reflected from each diffractor by controlling an electrostatic force generated by a driver coupled thereto. More preferably, the controller is further operable to provide a precise dosage of light from each pixel onto the surface of the workpiece to compensate for non-uniformities in light illuminating the SLM or in modulated light transmitted therefrom through the imaging optics.

The MEMS based SLM can include one or more of a grating light valve (GLV™), a planar light valve (PLV™) or a linear PLV (LPLV™), all of which are commercially available from Silicon Light Machines Inc., of San Jose CA.

The MEMS based SLM can be part of or included in a laser processing or manufacturing system, such as additive manufacturing, subtractive manufacturing, a Computer-to-Plate (CtP) printing or a maskless lithography system. Generally, the system includes: a workpiece support; a laser; a MEMS based SLM to modulate a beam generated by the laser; and imaging optics to direct modulated light from the optical modulator onto a workpiece on the workpiece support, wherein the MEMS based SLM has a number of surfaces that are deflected to modulate the beam generated by the laser.

BRIEF DESCRIPTION OF THE DRAWINGS

Embodiments of the present invention will be understood more fully from the detailed description that follows and from the accompanying drawings and the appended claims provided below, where:

FIG. 5C is a table giving a lowest absorption (k), and greatest index difference (n) and percent reflectance of different materials for use in a dielectric or Bragg mirror in the ultraviolet (UV), visible (VIS) and near infrared (NIR) wavelengths;

DETAILED DESCRIPTION

Figure 1A:
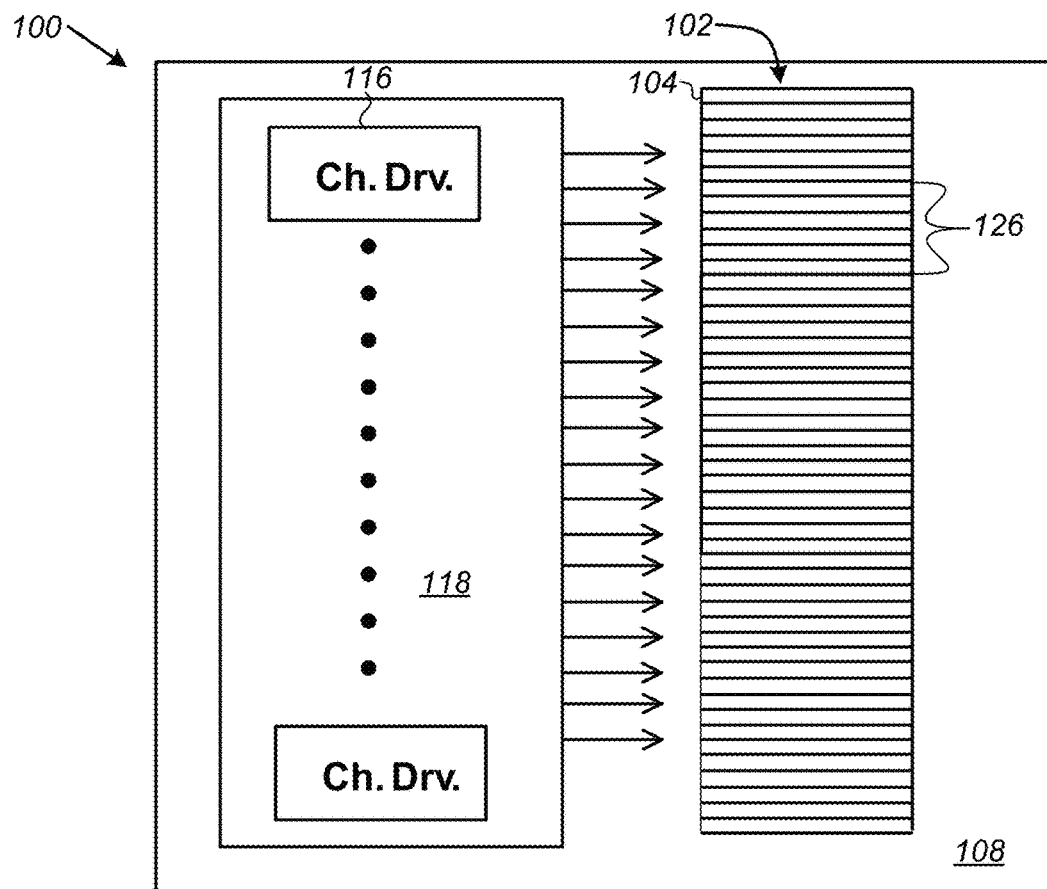
FIGS. 1A-1C illustrate schematic diagrams of an embodiment of a ribbon-type Microelectromechanical System (MEMS) based spatial light modulator (SLM) or Grated Light Valve (GLV)

Embodiments of microelectromechanical system (MEMS) based spatial light modulators (SLMs), and methods for operating the same for use in various applications, including printing, maskless lithography, additive manufacturing, subtractive manufacturing, and maskless lithography are disclosed. In the following description, numerous specific details are set forth, such as specific materials, dimensions and processes parameters etc. to provide a thorough understanding of the present invention. However, particular embodiments may be practiced without one or more of these specific details, or in combination with other known methods, materials, and apparatuses. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

An embodiment of a SLM including a multi-pixel, linear array of MEMS based ribbon-type, electrostatically adjustable diffractors, such as a GLV™ will now be described with reference to FIGS. 1A and 1B. For purposes of clarity, many of the details of SLMs in general and MEMS based ribbon-type diffractors in particular that are not relevant to the present invention have been omitted from the following description. The drawings described are only schematic and are non-limiting. In the drawings, the size of some of the elements may be exaggerated and not drawn to scale for illustrative purposes. The dimensions and the relative dimensions may not correspond to actual reductions to practice of the invention.

Figure 1B:
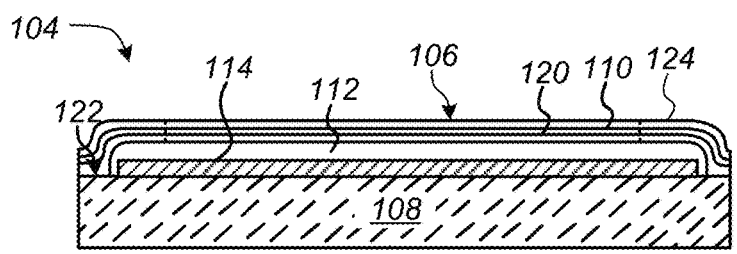

Referring to FIGS. 1A and 1B in the embodiment shown the SLM 100 includes a linear array 102 composed of thousands of free-standing, addressable electrostatically actuated ribbons 104, each ribbon having a light reflective surface 106 supported over a surface of a substrate 108, where a number of ribbons are grouped together to form the MEMS based diffractors. Each of the ribbons 104 includes an electrode 110 and is deflectable through a gap or cavity 112 toward the substrate 108 by electrostatic forces generated when a voltage is applied between the electrode 110 in the ribbon 104 and a base electrode 114 formed in or on the substrate. Each of the electrodes 110 are driven by one of a number of drive channels 116 in a driver 118, which may be integrally formed on the same substrate 108 with the linear array 102, as in the embodiment shown, or formed on a second substrate or chip and electrically coupled thereto (not shown).

A schematic sectional side view of a ribbon 104 of the SLM 100 of FIG. 1A is shown in FIG. 1B. Referring to FIG. 1B, the ribbon 104 includes an elastic mechanical layer 120 to support the ribbon above a surface 122 of the substrate 108, a conducting layer or electrode 110 and a reflective layer 124 including the reflective surface 106 overlying the mechanical layer and conducting layer.

Generally, the mechanical layer 120 can include a taut film or layer of a dielectric or semiconducting material, such as silicon (Si), silicon-dioxide ($SiO_2$), silicon nitride (SiN), silicon-oxynitride (SiN) or silicon-germanium (SiGe), and is flexibly supported above the surface 122 of the substrate 108 by a number of posts or structures, typically made of the same material as the mechanical layer 120, at both ends of the ribbon 104. The conducting layer or electrode 110 can be formed over and in direct physical contact with the mechanical layer 120, as shown, or underneath the mechanical layer. The conducting layer or electrode 110 can include any suitable conducting or semiconducting material compatible with standard MEMS fabrication technologies. For example, the conducting layer used for the electrode 110 can include a doped polycrystalline silicon (poly) layer, or a metal layer. If the reflective layer 124 is metallic it may also serve as the electrode 110. Alternatively, where the mechanical layer 120 includes silicon-germanium (SiGe) it may also serve as the electrode 110.

The separate, discrete reflecting layer 124, where included, can include any suitable metallic, dielectric or semiconducting material compatible with standard MEMS fabrication technologies, and capable of being patterned using standard lithographic techniques to form the reflective surface 106.

In the embodiment shown, a number of ribbons are grouped together to form a large number of MEMS channels or pixels 126, each driven by a much smaller number of drive channels 116. Deflection of a ribbon 104 causes light reflected from the reflective surface 106 to constructively or destructively interfere with light reflected from the reflective surface of an adjacent ribbon, there enabling the pixel 126 to switch between an on or bright state, an off or dark state or an intermediate gray-scale. In particular, it is noted that gray-scale control of the MEMS based diffractors can provide a precise dosage of light from each pixel onto the surface of a workpiece to be processed using the SLM 100 to compensate for non-uniformities in light illuminating the SLM or in modulated light transmitted from the SLM to a surface of the workpiece through imaging optics.

Figure 1C:
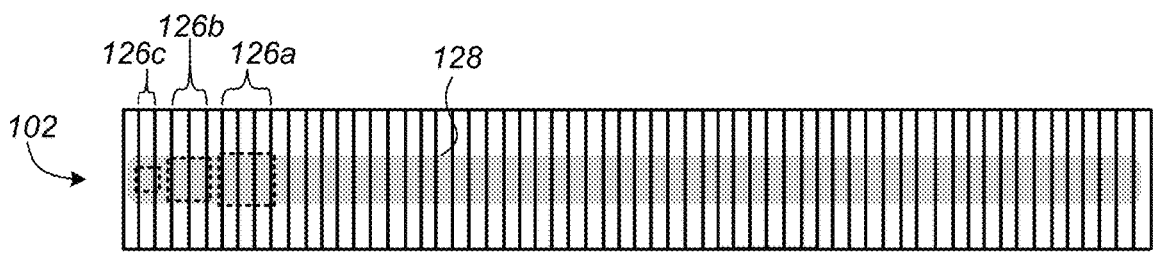

Referring to FIG. 1C in one embodiment the linear array 102 includes 1088 individually addressable ribbons 104 that can be grouped together to form channels or pixels 126 having any number of ribbons depending on pixel size requirements. Additionally, the SLM can include drive channels 116 (shown in FIG. 1A) with up to 10-bit amplitude modulation to support gray-scale, and is capable of being modulated or switched at speeds up to 350 kHz. Referring again to FIG. 1C, shaded rectangle illustrates an illuminated area 128 on the linear array 102 illuminated by a rectangular beam directed onto the SLM 100. In some embodiments for laser processing systems, it is desirable to provide pixel configurations having a square aspect ratio. For example, in the embodiment shown wherein the linear array 102 includes about ribbons 104, each having a width of about 25 µm, and the illuminated area 128 has a width of about 75 µm, the ribbons can be grouped to form 360 square pixels 126a each including portions of three adjacent ribbons. Alternatively, the width of the illuminated area can be reduced to about 50 µm and the ribbons 104 can be grouped to form 512 50 µm×50 µm square pixels 126b each including portions of two adjacent ribbons, or the width of the illuminated area can be further reduced to about 25 µm such that each ribbon forms 1088 25 µm×25 µm square pixels 126c.

Another type of SLM including a multi-pixel, linear array of MEMS based two-dimensional (2D) diffractors, such as a Linear Planar Light Valve (LPLV™) commercially available from Silicon Light Machines, Inc., of San Jose, California, will now be described with reference to FIGS. 2A through 2C and FIG. 3.

For purposes of clarity, many of the details of fabricating and operating MEMS based two-dimensional (2D) diffractors, which are widely known and not relevant to the present invention, have been omitted from the following description. MEMS based 2D diffractors are described in greater detail, for example, in commonly assigned U.S. Pat. No. 7,064,883, entitled, "Two-Dimensional Spatial Light Modulator," by Alexander Payne et al., issued on Jun. 20, 2006, and incorporated herein by reference in its entirety.

Figure 2A:
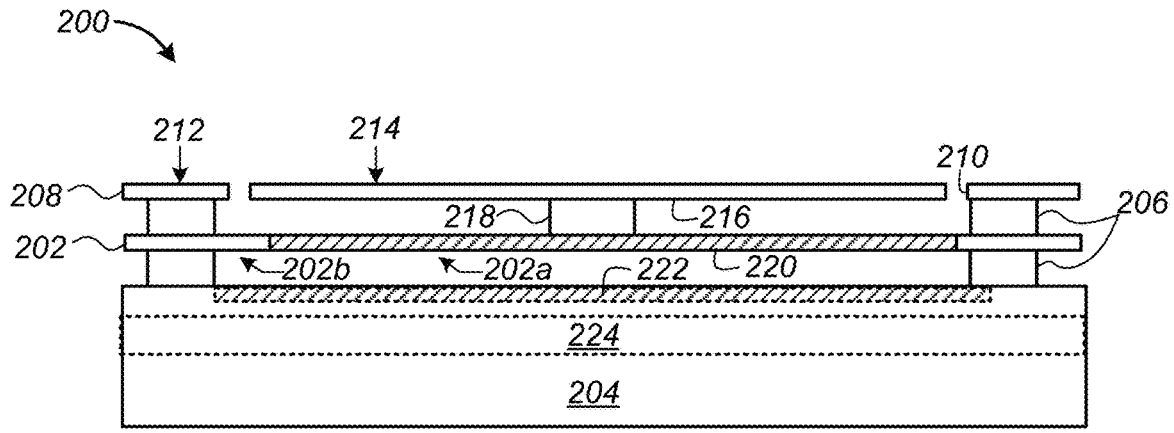
FIGS. 2A-2C illustrate schematic diagrams of an embodiment of a single two-dimensional (2D) MEMS based SLM or Planar Light Valve (PLV)

FIG. 2A illustrates a schematic block diagram of a sectional side view of a 2D modulator or diffractor 200 in a quiescent or un-driven state. Referring to FIG. 2A, the 2D diffractor 200 generally includes a piston layer 202 suspended over a surface of a substrate 204 by posts 206 at corners of the piston layer and/or 2D diffractor. The piston layer 202 includes an electrostatically deflectable piston 202a and a number of flexures 202b through which the piston is flexibly or movably coupled to the posts 206. A faceplate 208 overlying the piston layer 202 includes a first light reflective surface 210 and an aperture or cut-out portion 212 which separates the faceplate from a second reflective surface 214 on or attached to the piston 202a. The second light reflective surface 214 can either be formed directly on the top surface of the piston 202a, or, as in the embodiment shown, on a mirror 216 supported above and separated from the piston 202a by a central post 218 extending from the piston to the mirror. The first and second light reflective surfaces 210, 214, have equal area and reflectivity so that in operation electrostatic deflection of the piston 202a caused by an electrode 220 formed in or on the piston layer 202 and an electrode 222 in the substrate 204 brings light reflected from the first light reflective surface 210 into constructive or destructive interference with light reflected from the second light reflective surface 214.

Generally, the piston layer 220 can include a taut film or layer of a dielectric or semiconducting material, such as silicon (Si), silicon-dioxide (SiO$_2$), silicon nitride (SiN), silicon-oxynitride (SiN) or silicon-germanium (SiGe). Where the piston layer 220 includes SiGe it may also serve as the electrode 220. Alternatively, if the reflective layer 210 is metallic it may also serve as the electrode 220.

The electrode 222 in the substrate 204 is coupled to one of a number drive channels in a drive circuit or driver 224, which can be integrally formed in the substrate adjacent to or underlying the 2D diffractor 200, as in the embodiment shown. The electrode 222 in the substrate 204 can be coupled to the driver 224 through a via extending through the substrate from the driver to the electrode, and the electrode 220 formed in or on the piston layer 202 can be coupled to the driver or an electrical ground through a conductor extending through one of the posts 206 and the piston layer. As explained in greater detail below, typically multiple individual 2D diffractors 200 are grouped or ganged together under control of a single drive channel to function as a single pixel in the multi-pixel, linear array of the SLM.

Figure 2B:
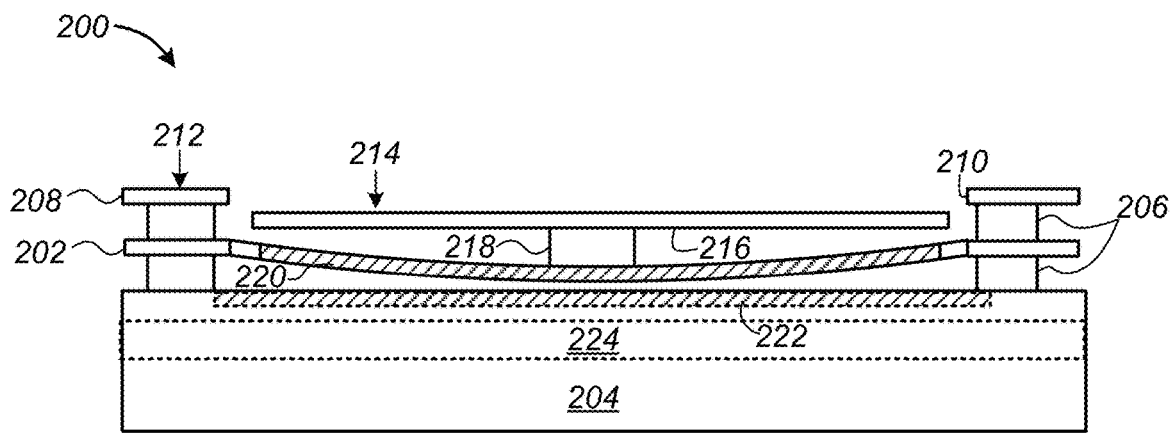
Figure 2C:
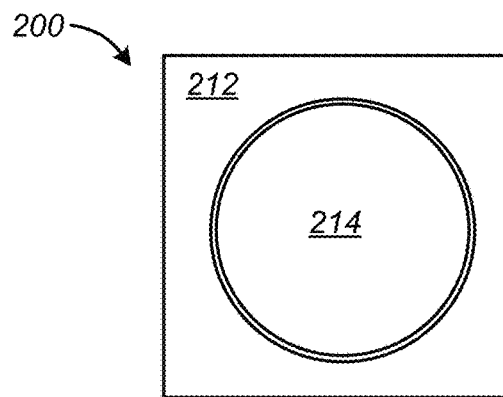

FIG. 2B is a schematic block diagram of the 2D diffractor 200 of FIG. 2A in an active or driven state, showing the piston 202a deflected towards the substrate 204, and FIG. 2C is a top view of the 2D diffractor of FIGS. 2A and 2B illustrating the static first light reflective surface 210 and the movable second light reflective surface 214.

Figure 3:
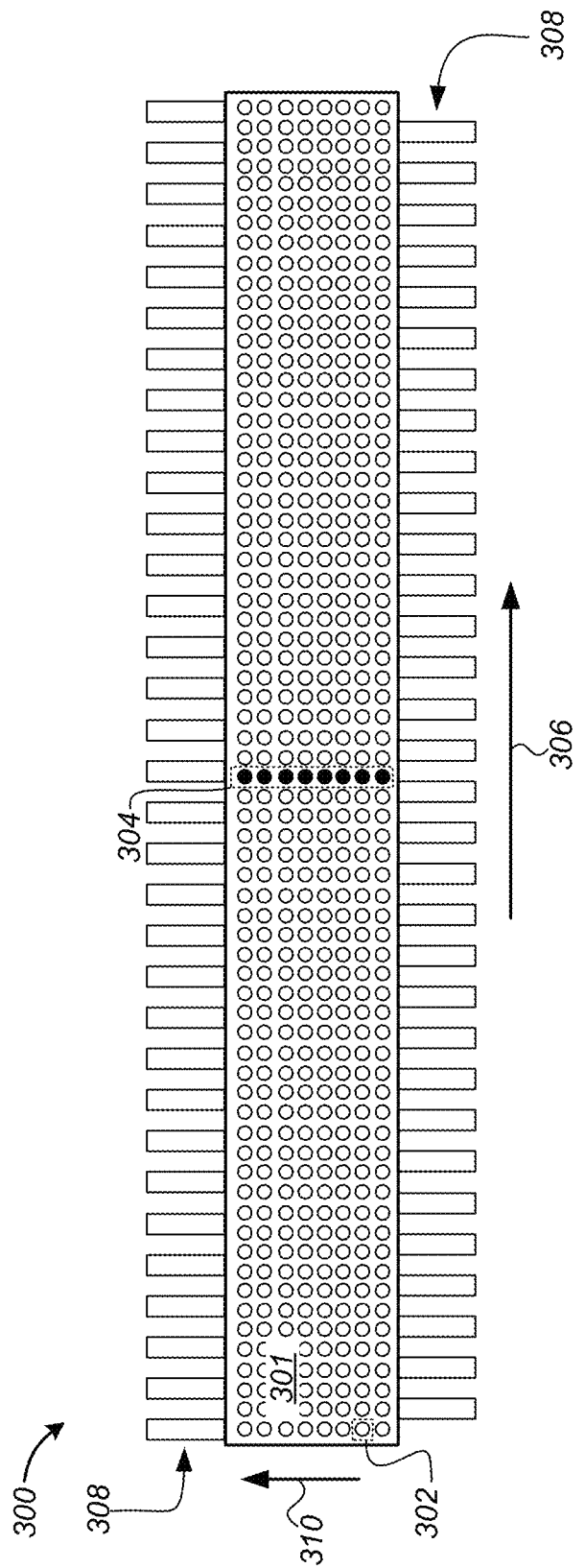
FIG. 3 is a schematic diagram of a top view of linear SLM including an array of 2D MEMS based SLM or linear PLV (LPLV), such as those shown in FIGS. 2A-C.

An exemplary multi-pixel, linear array of dense-packed, MEM based 2D modulators will now be described with reference to the block diagram of FIG. 3. FIG. 3 is a planar top view of a SLM 300 including a linear array 301 of 2D modulators 302, such as those shown in FIGS. 3A-C, grouped or coupled together to a number of drive channels to or pixels.

Referring to FIG. 3, in one embodiment the 2D modulators 302 are grouped into a linear array 301 of interleaved channels or pixels 304 along a first, horizontal or longitudinal axis 306. Each of the 2D modulators 302 in a single pixel 304 share a common drive channel or driver 308. Although in the embodiment shown each pixel 304 is depicted as having a single column of 12 modulators 302 grouped along a transverse or vertical or transverse axis 310 perpendicular to the horizontal or longitudinal axis 306 of the array, this is merely to facilitate illustration of the array. It will be appreciated that each channel or pixel can include any number of 2D modulators arranged in one or more columns of any length across the width or vertical or transverse axis of the array without departing from the spirit and scope of the invention. For example, in one embodiment of the SLM 300 particularly suited for the spectral shaping systems and methods of the present disclosure, each pixel 304 includes a single column of 40 modulators grouped along the transverse axis 310 of the array. Similarly, the SLM 300 can include a linear array 301 having any number of pixels 304 or a number of individual linear arrays placed end to end adjacent to one another. This later configuration can help to increase power handling of the SLM 300 as the optically active area of the linear array 301 gets larger by increasing the number of columns of modulators per pixel. If the damage threshold per modulator is constant, power handling can be increased proportional to the area increase.

In order to maximize or provide sufficient contrast for the SLM 300 it is desirable that incident light from an illumination source, have a numerical aperture (NA) or cone angle (θ) which is smaller than the first-order diffraction angle (θ) of the diffractive SLM 300. The diffraction angle (θ) of the SLM is defined as the angle between light reflected from a pixel 304 in the $0^{th}$ order mode or state, and light reflected from the same pixel in the plus and/or minus $1^{st}$ order mode. However, according to the grating equation, diffraction angles of a periodic surface, such as the linear array 301 of the SLM 300, are set by a ratio of wavelength of light incident on the array to a spatial period or pitch of features of the periodic surface, i.e., the pixels 304. In particular, the grating equation, equation 1 below, states:

$$\sin\theta = m\lambda / \Lambda \qquad (1)$$

where θ is a diffraction angle of light reflected from the surface, m is order of diffracted ray (integer), λ is the wavelength of the incident light, and Λ is a spatial or pitch of the modulator 302. When we focus on a single pixel which has multiple modulators 302 and the incident light is ideal plane wave or has a numeric aperture (NA)=0, the light spreads due to Huygen-Fresnel principle. The spreading angle Θ is defined by equation 2 below as:

$$\Theta = \lambda / D \qquad (2)$$

where D is a pixel size.

Achieving adequate contrast with conventional grating based SLMs requires either limiting illumination NA by means of an aperture (and suffering the associated throughput loss), or providing a large diffraction angle by reducing the size and spatial period or pitch of the individual modulators. However, this latter approach is problematic for a number of reasons including the need for larger, higher voltage drive circuits to drive smaller, movable grating elements, and a reduction of an optical power handling capability of the SLM resulting from such smaller grating elements.

In contrast to grating based SLMs, a SLM 300 including MEMS based 2D modulators 302, such as the LPLV™ is configured to have multiple pixels 304 each pixel including several modulators 302 arranged along the transverse or vertical axis 310 of the array (twelve in the embodiment shown), but with a much smaller number, generally only one or two modulators, arranged along the horizontal or longitudinal axis 306. Because of this, the spreading angle $\Theta_H$ of diffracted light from the pixel 304 along the longitudinal axis, where the pixel size is much smaller than along the vertical or transverse or transverse axis, is much larger than the spreading angle $\Theta_V$ of the pixel along the transverse axis. Conversely, the numerical aperture of illumination in the vertical direction (array short axis) can be much larger than the numerical aperture in the horizontal direction (array long axis) since the latter is limited by the diffraction angle of the SLM in order to achieve sufficient contrast. Thus by using a linear array of 2D modulators in combination with an asymmetric illumination NA in the longitudinal and transverse directions, the overall throughput of the spectral shaper can be improved.

Figure 4A:
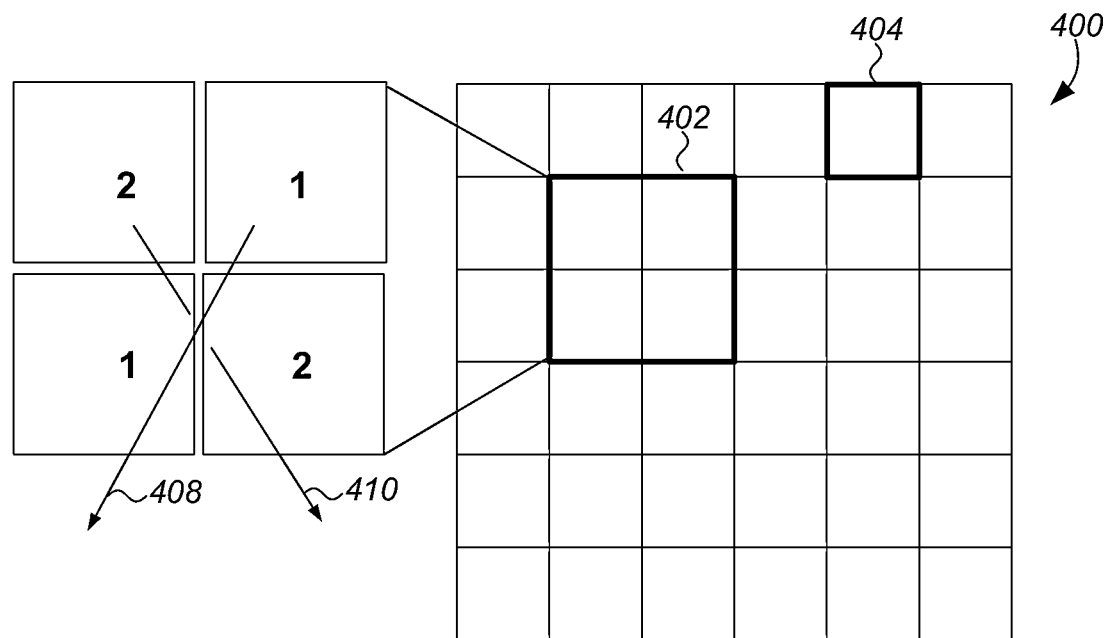
FIGS. 4A-4C illustrate a complex SLM suitable for use with a phase-modulated system.
Figure 4B:
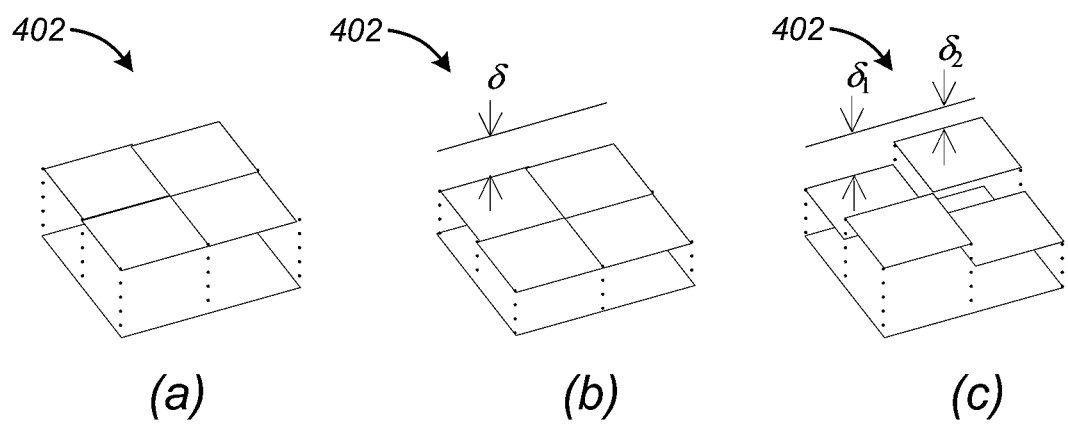
Figure 4C:
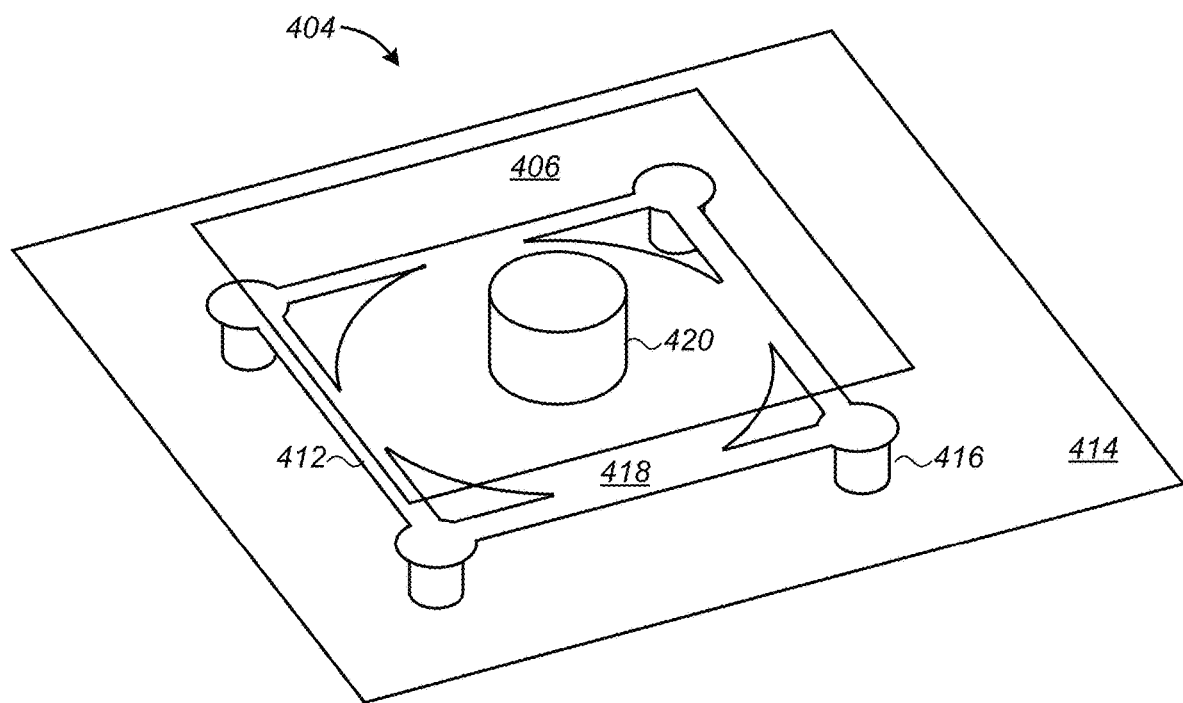

FIGS. 4A-4C illustrate schematic diagrams of a 2D MEMS based complex SLM for phase-modulation, for which the package and method of the present disclosure is particularly useful. Briefly, the complex SLM 400 includes multiple pixels 402, each pixel including multiple phase shift modulators 404. The phase shift modulators 404 each include an electrostatically displaceable mirror or reflective surface 406. The phase shift modulators 404 are configured such that substantially all light reflected from the complex SLM 400 comes from the phase shift modulators. Preferably, phase shift modulators 404 along diagonal lines 408, 410, are coupled to deflect in unison, by electrically interconnecting drive electrodes (not shown) below each phase shift modulator and applying a common drive voltage. In this way, each pixel 402 receives two independent driving voltages to deflect diagonally opposed phase shift modulators 404 as a group, denoted as group 1 and group 2 in FIG. 4A. The two groups, of each pixel 402 can be controlled independently of the other pixels to allow coherent light reflected from one pixel to constructively or destructively interfere with light reflected from one or more adjacent pixels, thereby modulating the light incident thereon. More preferably, the phase shift modulators 404 are deflectable through one or more wavelengths of light to enable both the phase and the amplitude of the reflected light to be modulated independently. FIG. 4B illustrates perspective views of a pixel 402 of the complex SLM 400 of FIG. 4A in (a) quiescent, (b) phase-modulated and (c) amplitude and phase modulated mode, where δ is equal to a quarter wavelength of the light incident on the complex SLM.

An exemplary embodiment of a phase shift modulator 404 of a complex SLM 400 will now be described in detail with reference to FIG. 4C. FIG. 4C depicts a detailed perspective view of a single phase shift modulator 404 in the complex SLM 400. Referring to FIG. 4C, the phase shift modulator 404 generally includes a film or membrane 412 disposed above an upper surface of a substrate 414 by a number of posts 416 with a displaceable or movable actuator or piston 418 formed therein. Supported above and affixed to each piston 418 by a support structure 420 is the reflective surface 406 that is positioned generally parallel to the surface of the substrate 414 and oriented to reflect light incident on a top surface of the complex SLM 400. The piston 418 and the associated reflective surface 406 form an individual phase shift modulator 404.

Individual pistons 418 or groups of pistons are moved up or down over a very small distance (typically only a fraction of the wavelength of light) relative to the substrate 414 by electrostatic forces controlled by drive electrodes (not shown) in the substrate underlying the actuator membrane 412. Preferably, the pistons 418 can be displaced by $n*\lambda/2$ wavelength, where λ, is a particular wavelength of light incident on the complex SLM 400, and n is an integer equal to or greater than 1. Moving the piston 418 brings reflected light from the planar light reflective surface 406 of one phase shift modulator 404 into constructive or destructive interference with light reflected by adjoining phase shift modulators in a pixel, thereby modulating light incident on the complex SLM 400.

Materials of the reflective surfaces of the ribbon-type MEMS based SLM 100, the SLM including 2D diffractors 200, and the complex SLM 400 are selected so that the SLMs are operable to modulate light ranging from deep ultraviolet light (DUV) to near-infrared (NIR) at wavelengths from 150 nm to 2 µm. Suitable reflective materials can include aluminum (Al), gold (Au), silver (Ag) or any other suitably reflective metal.

Figure 5A:
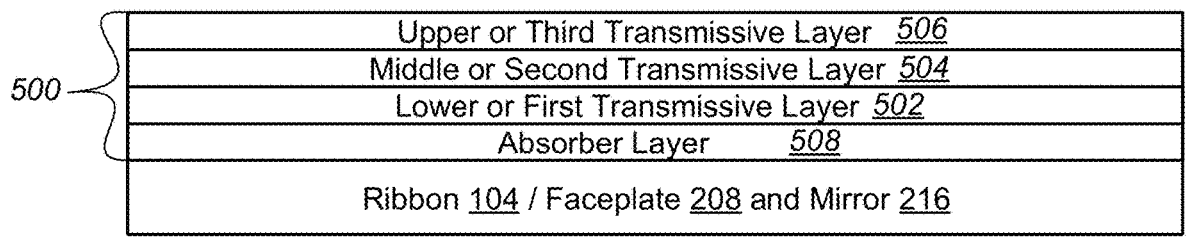
FIG. 5A schematic sectional side view of a stack of layers in a dielectric or Bragg mirror for use in a MEMS based SLM.

Alternatively, the reflective surfaces can include a multi-layer dielectric or Bragg mirror 500 including one or more alternating layers with different optical characteristics or properties, such as reflection, transmission and absorption depending on the wavelengths of the incident light being modulated. FIG. 5A show an embodiment of a Bragg mirror including a first or lower transmissive layer 502 overlying the reflective layer 124 of a ribbon 104 in a ribbon-type MEMS based SLM 100, or the faceplate 208 and/or mirror 216 of a 2D diffractor 200, a middle transmissive layer 504 on the first or lower transmissive layer, and a third or top transmissive layer 506 on the second or middle transmissive layer. The thicknesses of these layers are adjusted so as to comprise one quarter wave of the wave of the target wavelength. Suitable materials for the transmissive layers can include poly-crystalline silicon, silicon-oxide, silicon-carbide, aluminum-arsenide, zirconium-oxide and titanium-oxide. Optionally, in certain embodiments, such as that shown in FIG. 5A, the Bragg mirror 500 further includes an absorbing layer 508 to absorb and re-emit, or reflect incident light. Suitable materials for the absorbing layer 508 can include metallic films as well as native or doped semiconductors. The enhanced reflectivity of a stack of two or more transmissive layers over an absorbing layer reduces or substantially eliminates degradation of the ribbon-type MEMS based SLM 100 or the single-layer, 2D MEMS diffractor 200 as a consequence of high laser fluence. In particular, the Bragg mirror 500 is capable of withstanding laser energies in pulsed mode greater than about 1 millijoule (mJ), and in continuous wave (CW) mode powers of from about 500 watts (W) to greater than about 1 kilowatt (kW).

Figure 5B:
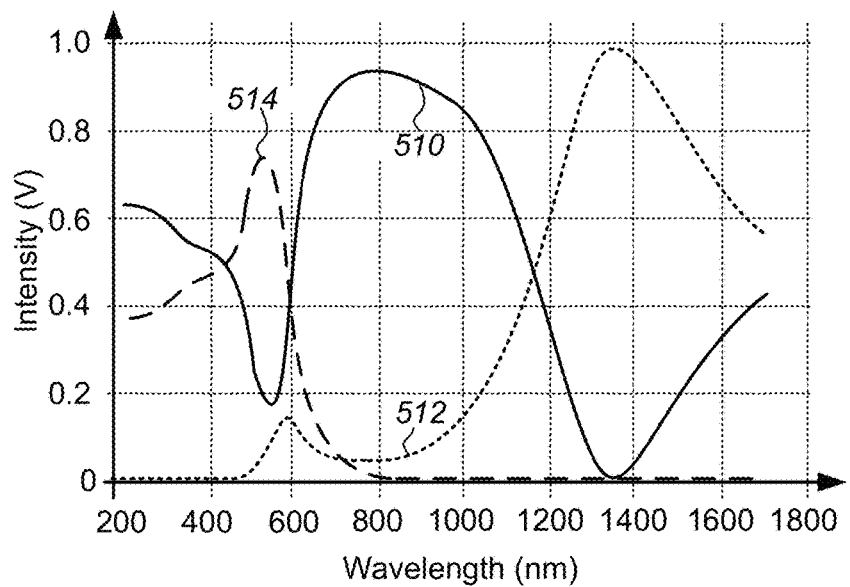
FIG. 5B is a graph illustrating the reflection, transmission and absorption of a dielectric or Bragg mirror including alternating layers of silicon-dioxide and poly-crystalline silicon at near-infrared (NIR) wavelengths.

FIG. 5B is a graph illustrating a reflection 510, transmission 512 and absorption 514 of a dielectric or Bragg mirror 500 including alternating transmissive layers of poly-crystalline silicon, silicon-dioxide and poly-crystalline silicon at near-infrared (NIR) wavelengths of from about 700 to 1000 nanometers (nm). Referring to FIG. 5B it is seen that a Bragg mirror including a first transmissive layer of 56 nm poly-crystalline silicon, a second transmissive layer of 68 nm silicon-dioxide and a top reflective layer of 56 nm poly-crystalline silicon, a second reflective layer of 68 nm silicon-dioxide exhibits a total reflection of about 95% at or near a center wavelength of 800 nm.

FIG. 5C is a table giving the lowest absorption (k), and greatest index difference (n) and percent reflectance of different materials for use in a dielectric mirror in the ultraviolet (UV), visible (VIS) and near infrared (NIR) wavelengths.

Advantages of the MEMS based SLMs, such as those described above, include:
a. Linear array pixel counts from about 1000 to about 8000 pixels;
b. Ability to modulate a wide range of laser wavelengths from 355 to 1064 nm, including about 514 nm;
c. Low mass and high tension of the electrostatically deflectable members enable high speed switching of less than about 300 ns—up to ten times faster digital micro-mirror devices (DMDs) and a thousand times faster than liquid crystal on silicon (LCOS) devices;
d. Natural Analog gray-scale control of modulated light intensity, with amplitude resolution limited only by bit-depth of drive channels;
e. High power handling due to the electrostatically deflectable member being made of silicon nitride, a robust, amorphous, high-temperature ceramic, with power densities up to and exceeding 10 kW/cm$^2$;
f. Non-contact, high reliability >10,000-hour lifetime demonstrated even under high-fluence UV illumination;
g. Borderless pixels with images being formed by spatially filtering the angularly modulated light, eliminating "screen door" effect of projected pixel images.

Figure 6:
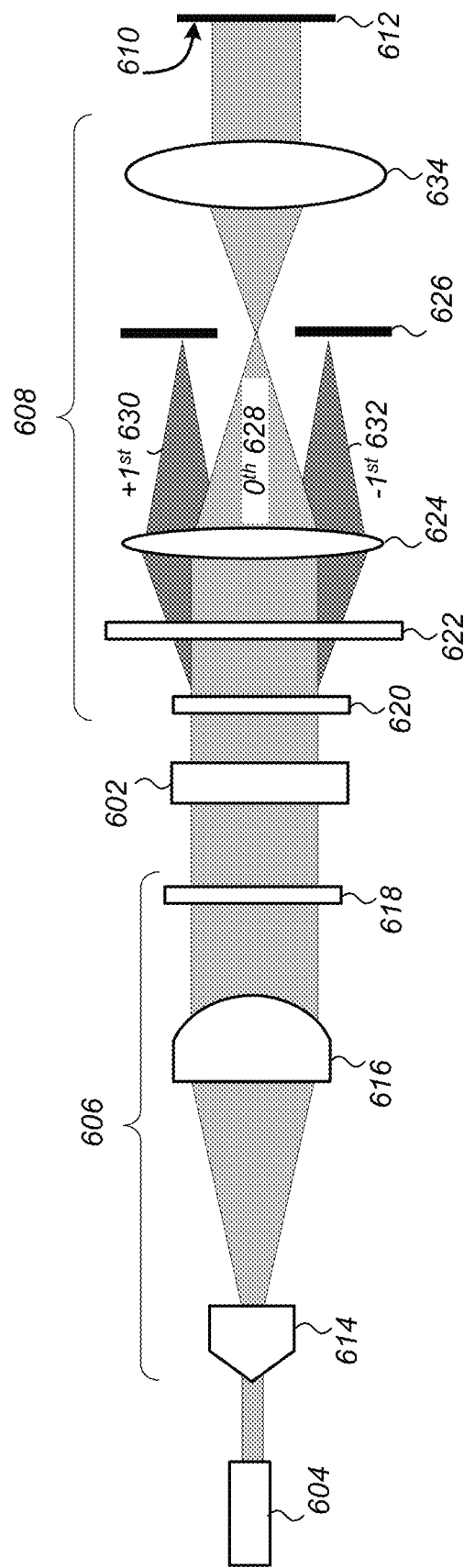
FIG. 6 is an optics diagram illustrating illumination and imaging light paths along a vertical or longitudinal axis of a linear array for a laser processing system including an SLM with a multi-pixel, linear array of MEMS based diffractors.

FIG. 6 is an unfolded optics diagram illustrating illumination and imaging light paths along a vertical or longitudinal axis of a linear array for an optical system including a MEMS based SLM and showing the separation of a $0^{th}$ order beam in the modulated light from $1^{st}$ order beams. For purposes of clarity and to simplify the drawings the optical light path is shown as being unfolded causing the SLM 602 to appear as transmissive. However, as noted above, it will be understood that because the SLM 602 is reflective the actual light path is folded to an acute angle at the SLM.

Referring to FIG. 6, the light path begins at a laser 604 and passes through anamorphic illumination optics 606, to illuminate a substantially linear portion of a linear array of the SLM 602, and imaging optics 608 to focus the modulated light onto a surface 610 of a workpiece 612. By workpiece 612 it is meant raw material or a partially finished piece that is shaped or processed by performing various operations using the SLM 602. In some embodiments, such as that shown, the illumination optics 606 are anamorphic illumination optics and can include a Powell lens 614, a long axis collimating lens 616, and a cylindrical, short axis focusing lens 618 to shape or focus the illumination into a substantially rectangular beam or line of illumination extending substantially uniformly across the linear array of the SLM 602. The imaging optics 608 can include a number of cylindrical lens 620 to direct modulated light to one or more galvanometric mirrors 622, a first Fourier Transform (FT) lens 624, a Fourier aperture 626 to separate a $0^{th}$ order beam 628 in the modulated light from $\pm 1^{st}$ order beams 630, 632, and a second inverse Fourier Transform (FT) lens 634.

Figure 7:
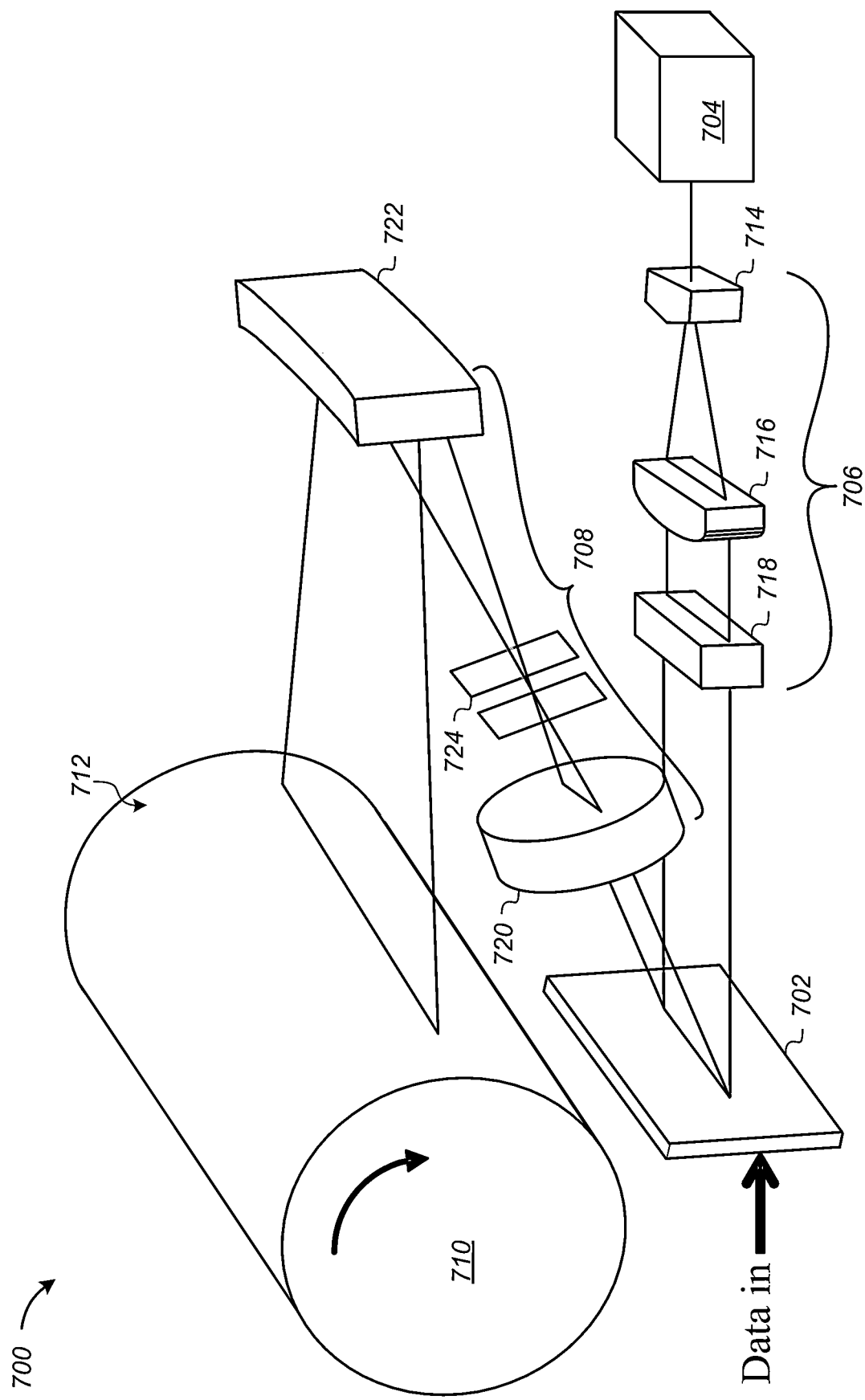
FIG. 7 is a schematic diagram of a printing system including a MEMS based SLM.

FIG. 7 is a schematic block diagram of a layout for a thermal, computer-to-plate (CtP) printing system including a SLM including a linear array of 2D MEMS modulators enclosed in a package including a cavity filled with a low molar mass and high thermal conductivity fill gas. Referring to FIG. 7, a printing system or printer 700 including a linear array of 2D modulators 702, such as shown in FIGS. 2A through 2C, or a multi-pixel, linear array of 2D modulators, such as shown in FIGS. 3A through 3C and FIG. 4, is shown in FIG. 7. An advantage of using a linear array of 2D modulators in this application is that it eliminates the need for a scanning mirror and f-θ or scanning optics of conventional SLM by replacing them with a linear array of 2D modulators 702 sufficiently large along a longitudinal axis to project modulated light over a swath extending substantially across the entire width of an imaging or focal plane. The printer 700 generally comprises an illuminator or light source 704, illumination optics 706, and imaging optics 708 to direct an image (modulated light) from the linear array of 2D modulators 702 onto a photoconductive or photosensitive surface of an imaging or focal plane on a substrate, shown here as a drum 710 with a photoconductive layer on a surface 712 thereof.

The light source 704 can include any light emitting device capable of continuously emitting light at a sufficient power level or power density, and, preferably at a single or narrow range of wavelengths to enable light reflected from modulators of the linear array of 2D modulators 702 to be modulated in phase and/or amplitude by diffraction. In certain printing applications, and in particular in photothermal printers, the light source 704 can include a number of lasers or laser emitters, such as diode lasers, each powered from a common power supply (not shown). Preferably, the light source 704 is a high-power laser capable of operating in ultraviolet (UV) wavelengths of from 355 nanometers (nm) through infrared (IR) wavelengths up to about 2000 nm in either a continuous wave (CW) mode, or in a pulse mode with widths or durations of from about 1 femtoseconds (fs) up to about 500 nanoseconds (ns) at a repetition rate of from about 10 kHz up to about 300 kHz.

The illumination optics 706 can comprise a number of elements including lens integrators, mirrors and prisms, designed to transfer light from the light source 704 to the linear array of 2D modulators 702 such that a line of a specified length and width is illuminated on the linear array. In the embodiment shown, the illumination optics 706 include a prism 714 and lens 716 to refract and transmit light from the light source 704, and an integrator 718 to illuminate a swath covering substantially the full width of the linear array.

The imaging optics 708 can include magnification elements, such as a Fourier Transform (FT) lens 720 and a FT mirror 722, to direct the light from the linear array of 2D modulators 702 to the photoconductive layer located on the drum 710. Preferably, the imaging optics 708 is designed to transfer light from the linear array of 2D modulators 702 to the drum 710 such that a photoconductive layer located on the drum is illuminated across a swath covering substantially the full width of the drum. Optionally, as in the embodiment shown, the imaging optics 708 further includes filter elements, such as a FT filter 724, to resolve light reflected from each pixel but not light reflected from each individual modulator or diffractor or from each element in each modulator.

As described above with reference to FIGS. 2A-C and 3, the linear array of 2D modulators 702 includes a linear array of a number of individual diffractive two-dimensional (2D) densely packed spatial light modulators or diffractors (not shown in this figure). Adjacent 2D modulators may be grouped or functionally linked to provide a number of pixels in the linear array that can be controlled by drive signals from a single, common drive channel to print to the imaging plane with a desired resolution. Preferably, the linear array of 2D modulators 702 has a pixel count adequate to cover a swath or strip extending substantially across the entire width of the photo or thermal-sensitive surface of the imaging plane. More preferably, the linear array of 2D modulators 702 has a pixel count of at least about 500 pixels, and most preferably at least about 1000 pixels to provide the desired resolution. For example, in one version of the layout illustrated in FIG. 7, the linear array of 2D modulators 702 includes a sufficient number of pixels to cover an entire swath on a write drum 710 with a printing resolution of about 2000 dots-per-inch (dpi) using a modest-power, 780 nm GaAs diode laser as the light source 704.

Figure 8:
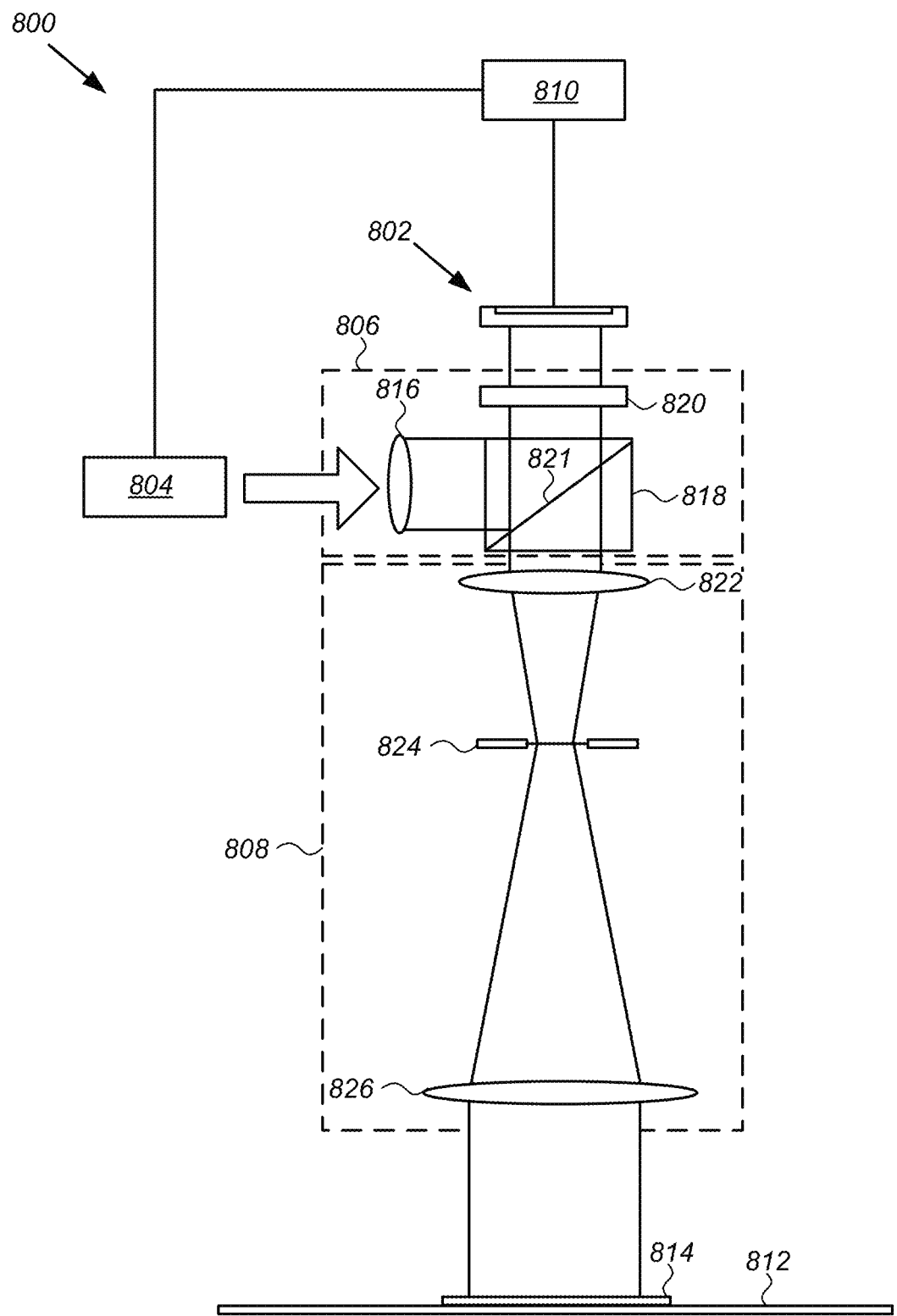
FIG. 8 is a schematic block diagram of a lithographic system including a SLM assembly including a MEMS based SLM.

In another embodiment, shown in FIG. 8, the printing system is a direct write or maskless lithography system 800 including a SLM with a linear array of 2D modulators and further comprising a pattern generator to generate and transmit to the number of 2D modulators drive signals to manufacture micro-electronic devices. By micro-electronic devices it is meant integrated circuits (ICs) and Micro-Electromechanical System or MEMS devices. In maskless lithography, light used to expose the photosensitive material in an image plane on a substrate, such as silicon or semiconductor wafer, on which the device is to be formed.

Referring to FIG. 8 the maskless lithography system 800 includes a MEMS based SLM 802, a high powered, CW, or nano-, pico- or femto-second pulsed laser 804, imaging optics 806 and illumination optics 808, a controller 810 to provide voltages to drive the MEMS based SLM and control operation of the laser 804 and a workpiece support 812 to hold a target workpiece 814, such as a wafer or substrate on which a MEMS device or semiconductor integrated circuit is to be fabricated.

Generally, the illumination optics 806 include a number of elements including lenses, mirrors and prisms, designed to transfer a light beam from the laser 804 to the MEMS based SLM 802 to illuminate an area substantially equal to that of the reflective surface of the MEMS based SLM. In the embodiment shown, the illumination optics 808 includes a Powell lens 816, polarizing beam splitter (PBS 818), and a cylindrical, short axis focusing lens 820 to shape or focus the illumination into a substantially rectangular beam or line of illumination extending substantially uniformly across the linear array of the MEMS based SLM 802. The PBS 818 reflects light having a first polarization towards the MEMS based SLM 802, and transmits modulated light having a second polarization away from the MEMS based SLM towards the target workpiece 814 through the imaging optics 808. For example, the PBS 818 can be adapted to reflect light having a Transverse-Electric (TE) polarization towards the MEMS based SLM 802, and to transmit light having a Transverse-Magnetic™ polarization toward the target workpiece 814. The light that is initially directed toward the MEMS based SLM 802 by the PBS 818 in the TE state will pass twice through a quarter-wave plate (QWP 821) of the PBS, thus converting it to TM polarization and allowing to pass through the PBS and on to the imaging optics 808 that follow.

As shown, the imaging optics 808 can include magnification and filtering elements, such as a first Fourier Transform (FT) lens 822 to focus and direct light from the PBS 818 onto a FT filter 824 to select the 0th order modulated light, and a second, larger Inverse FT lens 826 to enlarge the image generated by the SLM 802 and project it onto the target workpiece 814.

Figure 9A:
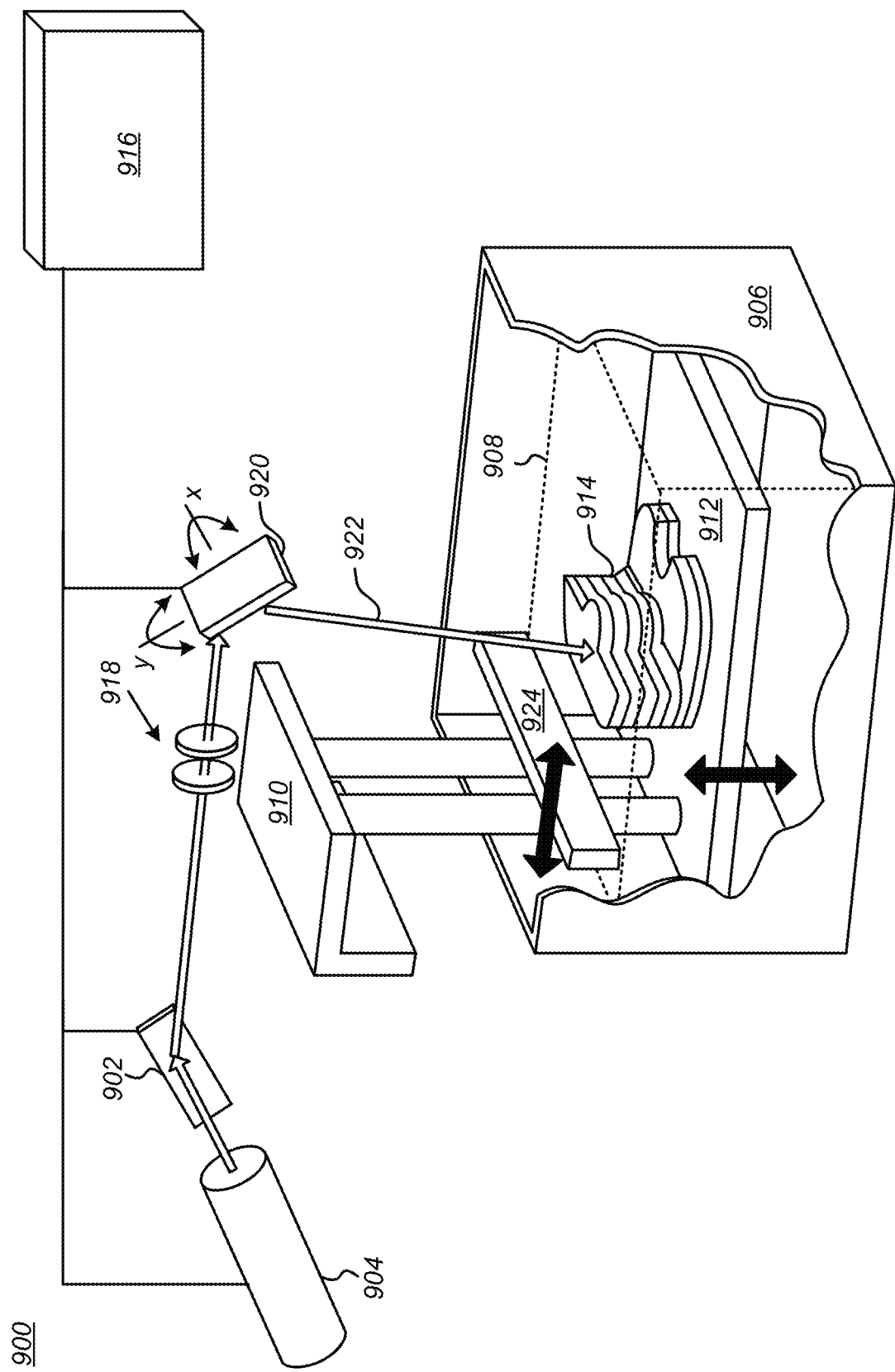
FIG. 9A is a block diagram illustrating an additive manufacturing system including a MEMS based SLM.

An embodiment of a polymerization three-dimensional (3D) printing or additive manufacturing system including MEMS based SLM will now be described with reference to FIGS. 9A and 9B. Referring to FIG. 9A, the 3D printing system 900 generally includes a MEMS based SLM 902 with a number of pixels, each with multiple modulators to modulate a beam of light generated by a laser 904, a vat 906 containing the photopolymer or resin 908 (indicated by dashed lines), and a transport mechanism 910 to raise and lower a work surface 912 on which an object 914 is printed into the vat as indicated by the vertical arrow. As noted above, the laser 904 is preferably a high power laser capable of operating in UV wavelengths of from 355 nm through IR wavelengths up to about 2000 nm in either CW mode, or in a pulse mode with widths or durations of from about 1 fs up to about 500 ns at a repetition rate of from about 10 kHz up to about 300 kHz, and at energy ranges of from about 10 microjoules (μJ) up to greater than 10 millijoules (mJ).

In one embodiment particularly useful for additive manufacturing systems the laser 904 is capable of operating in CW mode at wavelengths (λ) of from about 350 nm to about 1550 nm, and at powers of about 500 Watts (W) to greater than about 1 kilowatt (kW).

Referring again to FIG. 9, the 3D printing system 900 further includes imaging optics 918 to transfer modulated light from the SLM toward an imaging or focal plane on the work surface 912, a controller 916 to control operation of the laser 904, SLM 902 and transport mechanism 910. In some embodiments, the imaging optics 918 can include magnification and filtering elements, such as a first Fourier Transform (FT) lens to focus and direct light from the SLM 902 onto a scanning mirror 920 that rotates to scan a modulated beam 922 along a x-axis and a y-axis on a surface of the resin 908 immediately above or adjacent to the work surface 912.

The transport mechanism 910 is adapted and controlled by the controller 916 to lower the work surface 912 into the vat 906 as the modulated light converts the liquid resin 908 into a solid, building successive layers or cross-sections of the object 914 to be printed. Generally, the 3D printing system 900 further includes a sweeper 924 adapted to move as indicated by the horizontal arrow to spread or smooth fresh resin 908 over surface sections of the object 914 being printed.

Figure 9B:
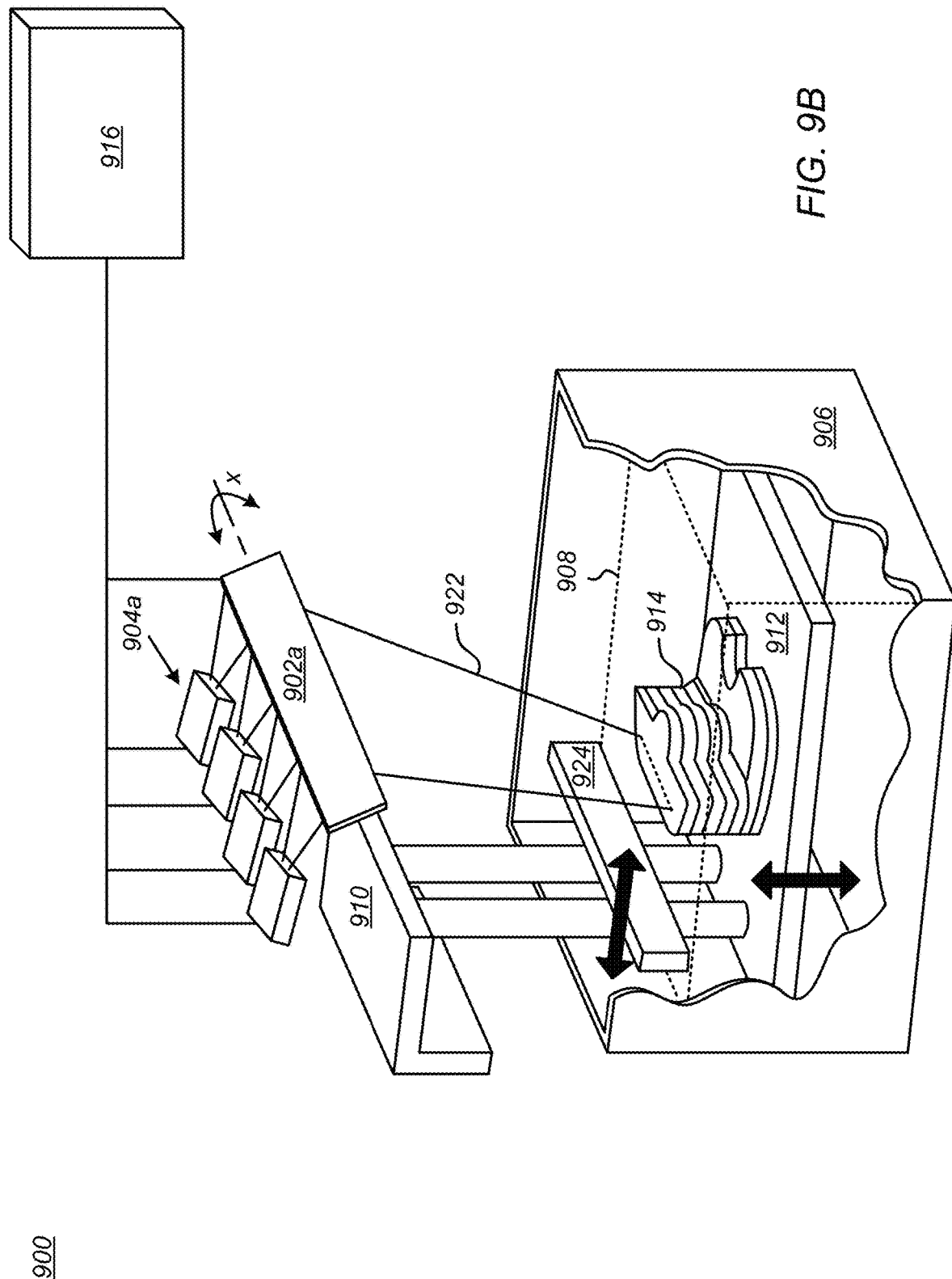
FIG. 9B is a block diagram illustrating another additive manufacturing system including a MEMS based SLM and multiple laser sources.

FIG. 9B is a schematic block diagram of an alternative embodiment of the 3D printing system 900 of FIG. 9A including a laser light bar or multiple lasers 904a to illuminate a large, linear SLM 902a and expose a substantially linear swath 922 on a surface of the resin 908 immediately above or adjacent to the work surface 912. As with the embodiment of FIG. 9A, a sweeper 924 moves as indicated by the horizontal arrow to spread or smooth fresh resin 908 over surface sections of the object 914 being printed, and the 3D printing system 900 further includes a controller 916 to control operation of the laser 904, SLM 902a, transport mechanism 910 and sweeper.

An advantage of the 3D printing system 900 of FIG. 9B over that of FIG. 9A is the elimination of the need for a separate scan mirror 920 (not shown in this figure) as the large, linear SLM 902a illuminate a substantially linear swath over the work surface 912 in a first or y direction, and the SLM can itself be rotated if desired to scan in a second or x direction as shown schematically in FIG. 9B.

Alternatively, as with the embodiment of FIG. 9A, the 3D printing system 900 of FIG. 9B can further include a scanning mirror (not shown in this figure) located between the SLM 902a and the work surface 912 capable of rotating along either or both of an x-axis and a y-axis laterally to enable simultaneous or rapid sequential printing of multiple objects or objects larger than the area imaged onto the work surface.

Optionally, in either of the above embodiments the transport mechanism 910 can be further adapted to move or reposition the work surface 912 laterally to enable simultaneous printing of multiple objects or objects larger than the area imaged onto the work surface.

Figure 10:
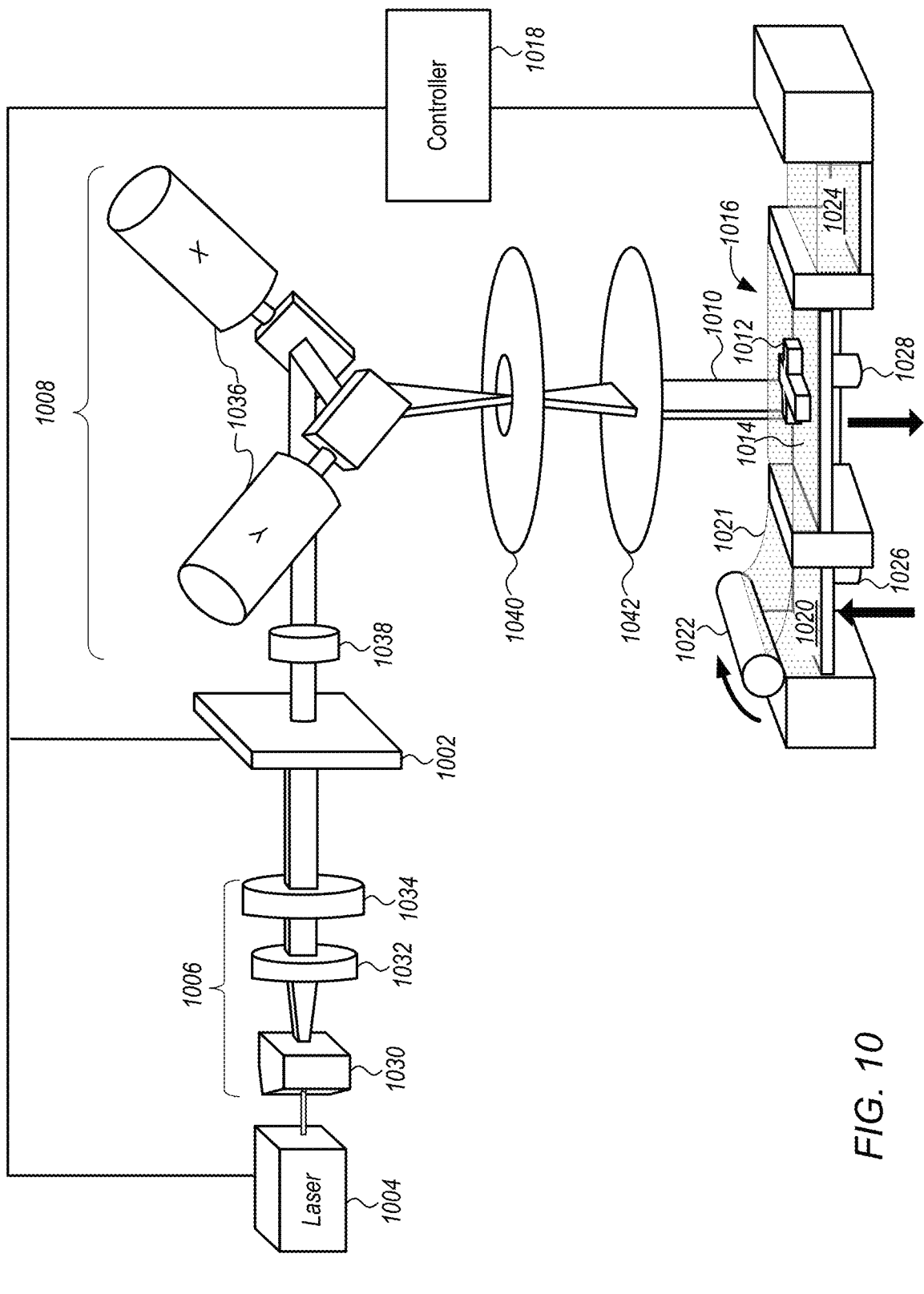
FIG. 10 is a block diagram illustrating a selective laser sintering system including a MEMS based SLM.

FIG. 10 is a block diagram illustrating a selective laser sintering (SLS) system 1000 including a MEMS based SLM 1002. Referring to FIG. 10, the SLS system 1000 includes, in addition to a MEMS based SLM 1002, a laser 1004 operable to generate laser light used to illuminate the SLM, illumination optics 1006 to direct laser light onto the SLM, imaging optics 1008 operable to focus a substantially linear swath of modulated light 1010 onto a surface of a workpiece 1012 held or affixed to a fixture 1014 or stage positioned in a work area 1016, and a controller 1018 operable to control the SLM, laser and imaging optics to scan the linear swath of modulated light across the surface of the workpiece to fuse a layer of sinterable powder over a surface the workpiece, to manufacture a desired article layer by layer.

Generally, the SLS system 1000 further includes a first tank or reservoir 1020 in which a sinterable metallic, plastic or ceramic powder 1021 is held, a powder layering mechanism, such as a roller 1022, to form a layer of sinterable powder over a surface the workpiece in the work area 1016, and a catch reservoir 1024 into which excess powder is caught. In operation a first elevator 1026 raises the powder 1021 which is then spread by the layering mechanism (roller 1022) over a surface of the workpiece 1012 to form a thin layer, which is then fused by modulated laser light from the SLM 1002 to form an additional layer on the workpiece. After the layer has been formed, the laser 1004 is turned off, and a second elevator 1028 lowers the fixture 1014 on which workpiece 1012 is held. The layering mechanism (roller 1022) is then returned to a position near or over the first tank or reservoir 1020, the first elevator 1026 raises the powder 1021 and the process is repeated.

As noted above, the laser 1004 is capable of operating in UV wavelengths of from 355 nm through IR wavelengths up to about 2000 nm in either CW mode, or in a pulse mode with widths or durations of from about 1 fs up to about 1000 ns at a repetition rate of from about 10 kHz up to about 300 kHz, and at energy ranges of from about 10 microjoules (μJ) up to greater than 10 millijoules (mJ).

The SLM 1002 can include a multi-pixel, linear array of MEMS based, ribbon-type diffractors, such as shown in FIGS. 1A through 1C, or a multi-pixel, linear array of 2D diffractors, such as shown in FIGS. 2A through 2C and FIG. 3.

The illumination optics 1006 can include a beam forming optical system to direct laser light onto the SLM 1002. Referring to FIG. 10, elements of the beam forming optical system can include a Powell lens 1030, a long axis collimating lens 1032, and a cylindrical, short axis focusing lens 1034 to shape or focus the illumination into a rectangular beam or line of illumination extending substantially uniformly across the linear array of the SLM 1002.

The imaging optics 1008 can include galvanometric mirrors 1036 to scan the linear swath of modulated light 1010 across the surface of the workpiece 1012, a cylindrical lens 1038 to direct modulated light to the galvanometric mirrors, a Fourier aperture 1040 to separate a $0^{th}$ order beam in the modulated light from $1^{st}$ order beams, and a Fourier Transform (FT) lens 1042 to focus the modulated light onto the surface of the workpiece. Preferably, the cylindrical lens 1038 and FT lens 1042 of the imaging optics include fused silica lenses to reduce thermal focus shift of the modulated light focused onto the surface of a workpiece 1012.

Figure 11:
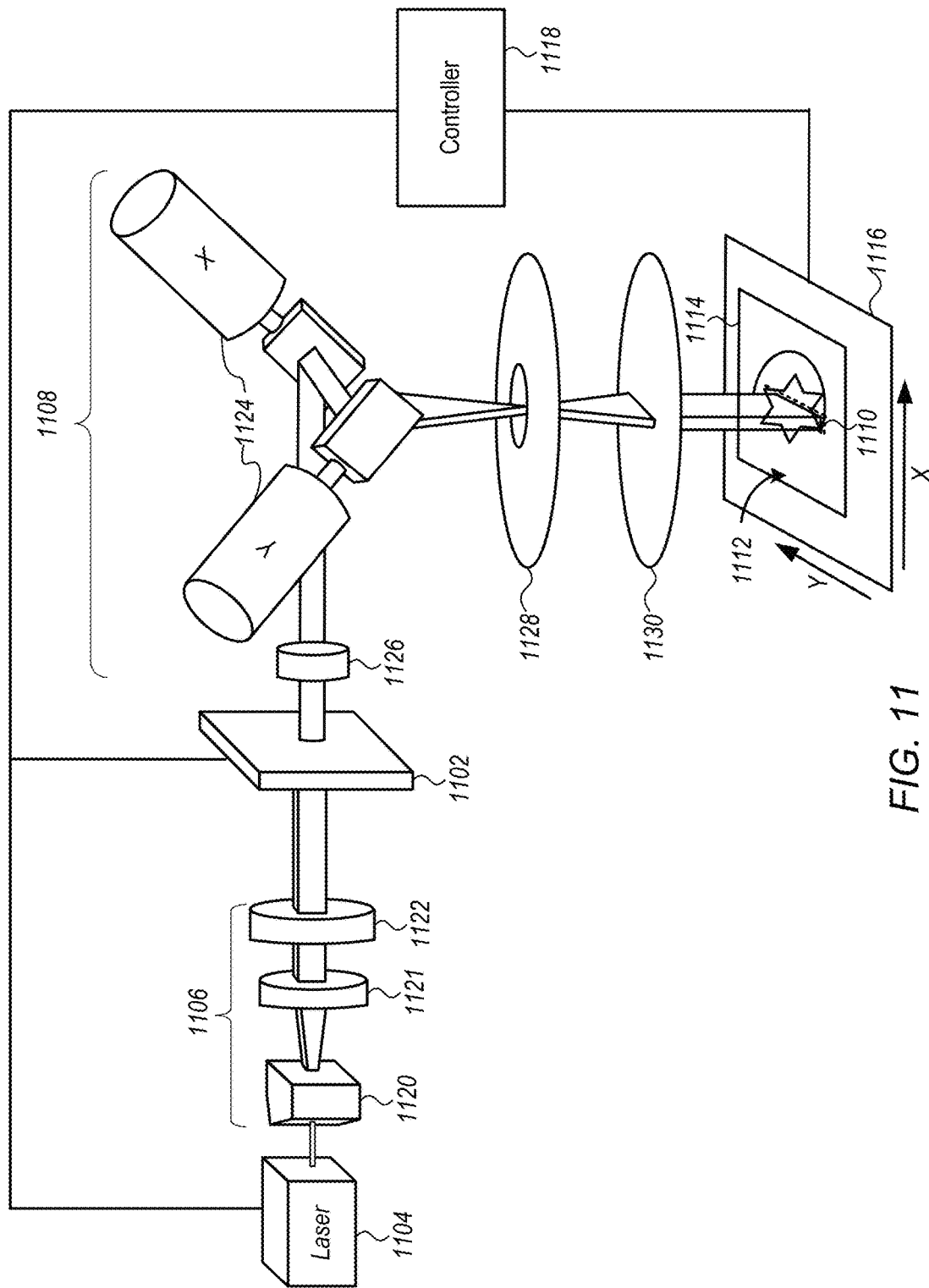
FIG. 11 is a block diagram illustrating a laser micromachining system including a MEMS based SLM suitable for use in a surface modification or subtractive manufacturing system.

FIG. 11 is a block diagram illustrating a laser micromachining system including a MEMS based SLM suitable for use in a surface modification or subtractive manufacturing system. By subtractive manufacturing system it is meant a system in which a high power laser is used to remove portions of a workpiece, such as an ingot or substrate, by melting or ablation to manufacture a desired article. Referring to FIG. 11, the laser micromachining system 1100 includes, in addition to a MEMS based SLM 1102, a laser 1104 operable to generate laser light used to illuminate the SLM, illumination optics 1106 to direct laser light onto the SLM, imaging optics 1108 operable to focus a substantially linear swath of modulated light 1110 onto a surface 1112 of a workpiece 1114 on or affixed to a fixture 1116 or stage, and a controller 1118 operable to control the SLM, laser and imaging optics to scan the linear swath of modulated light across the surface of the workpiece to remove portions of the workpiece by melting or ablation to manufacture a desired article.

As noted above, the laser 1104 is capable of operating in UV wavelengths of from 355 nm through IR wavelengths up to about 2000 nm in either CW mode, or in a pulse mode with widths or durations of from about 1 fs up to about 1100 ns at a repetition rate of from about 10 kHz up to about 300 kHz, and at energy ranges of from about 10 microjoules (µJ) up to greater than 10 millijoules (mJ)

The SLM 1102 can include a multi-pixel, linear array of MEMS based, ribbon-type diffractors, such as shown in FIGS. 1A through 1C, or a multi-pixel, linear array of 2D diffractors, such as shown in FIGS. 2A through 2C and FIG. 3.

The illumination optics 1106 can include a beam forming optical system to direct laser light onto the SLM 1102. Referring to FIG. 11, elements of the beam forming optical system can include a Powell lens 1120, a long axis collimating lens 1121, and a cylindrical, short axis focusing lens 1122 to shape or focus the illumination into a rectangular beam or line of illumination extending substantially uniformly across the linear array of the SLM 1102.

The imaging optics 1108 can include galvanometric mirrors 1124 to scan the linear swath of modulated light 1110 across the surface 1112 of the workpiece 1114, a number of cylindrical lens 1126 to direct modulated light to the galvanometric mirrors, and a Fourier aperture 1128 to separate a $0^{th}$ order beam in the modulated light from $1^{st}$ order beams, and a Fourier Transform (FT) lens 1130 to focus the modulated light onto the surface of the workpiece.

Preferably, the cylindrical lens 1126 and FT lens 1130 of the imaging optics include fused silica lenses to reduce thermal focus shift of the modulated light focused onto the surface 1112 of a workpiece 1114. In some embodiments, one or more of the lenses 1120, 1121, 1122 of the illumination optics 1106 can also include fused silica lenses to reduce thermal focus shift of the laser light focused onto the SLM 1102.

The fixture 1116 on which the workpiece 1114 to be marked or ablated is placed or affixed can include a static fixture, or a movable stage operable to move or reposition the workpiece relative to a substantially stationary linear swath of modulated light, to scan the linear swath of modulated light across the surface of the workpiece. In either embodiment, whether static or movable, the fixture 1116 preferably includes a number of sensors and signaling means to signal other components in the laser micromachining system when the workpiece is in proper position to be marked or ablated.

Figure 12:
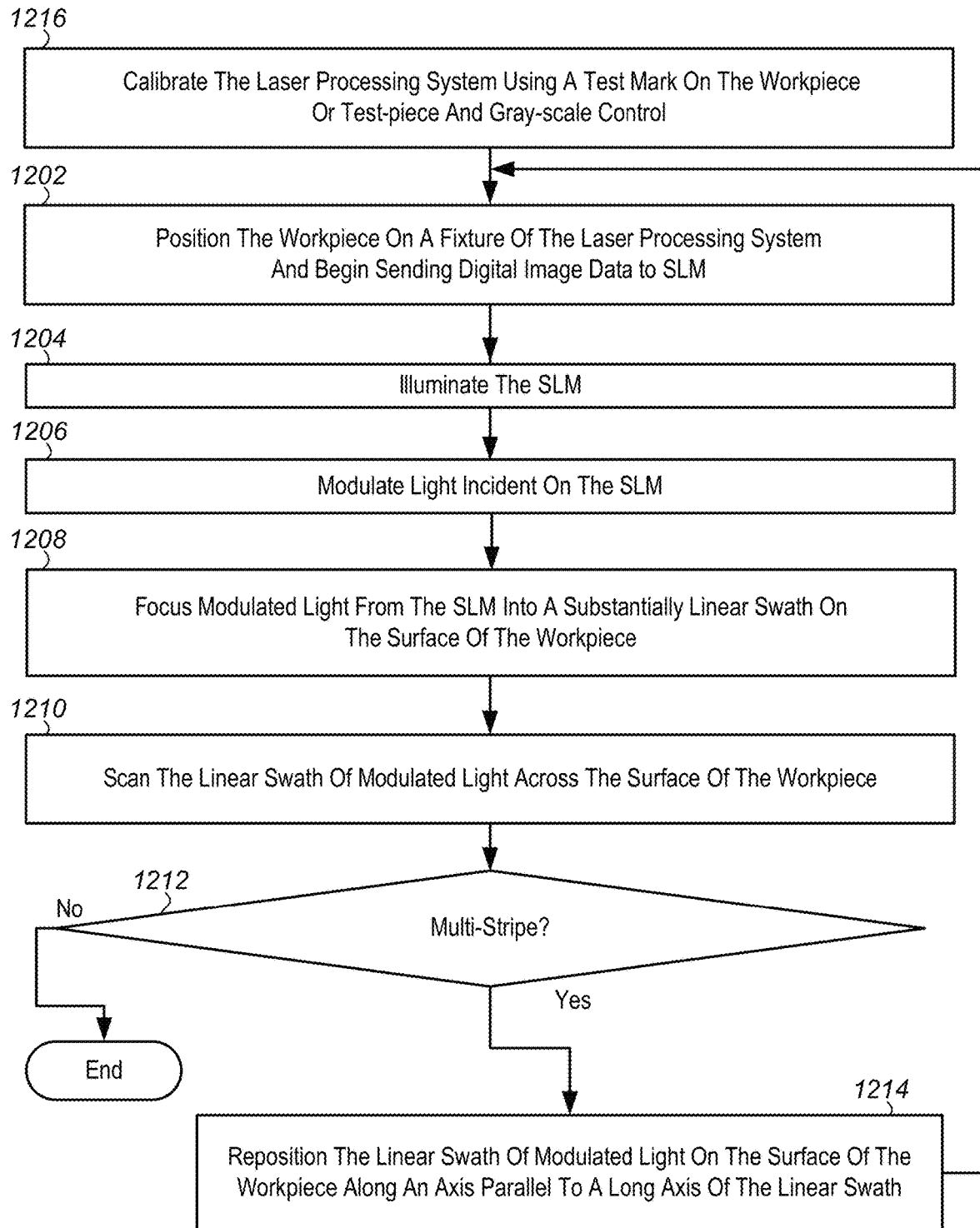
FIG. 12 is a flowchart of a method of manufacturing an article using a laser processing system including a MEMS based SLM.

FIG. 12 is a flowchart of a method of manufacturing an article using a laser processing system including a MEMS based SLM. Referring to FIG. 12, the method begins with positioning a workpiece on a fixture of a laser processing system, and beginning to send digital image data to a SLM of the laser processing system (1202). When it has been detected that the workpiece is positioned on the fixture, digital image data received by the SLM, and the diffractors settled, generating light from a laser (1204). Generally, this can be accomplished by sending a pulse of the appropriate duration to the laser through a control bus. Next, light from the laser is optically coupled to the SLM to substantially uniformly illuminate a linear array of the SLM, and light incident on the SLM modulated (1206). Modulated light from the SLM is then projected and focused into a substantially linear swath on a surface of the workpiece using imaging optics; the linear swath includes light from multiple pixels of the SLM (1208). Next, the laser, SLM, and a scanner or galvanometric mirrors in the imaging optics operated to scan the linear swath of modulated light across the surface of the workpiece (1210). It is then determined if a multi-stripe is necessary or desired (1212). If a multi-stripe is not necessary, i.e., if a single-stripe scan is sufficient to record the desired image, the process ends. If a multi-stripe is necessary, due either to a size of the image, a length of the linear swath of modulated light, or a desired resolution or contrast in the image recorded, the linear swath of modulated light is repositioned or indexed on the surface of the workpiece along an axis parallel to a long axis of the linear swath (1214) and the process repeated.

Optionally, as in the embodiment shown in FIG. 12, the method can further include an initial calibration step (step 1216), in which the laser processing system is calibrated using test mark or pattern either on the workpiece or a test-piece positioned on the fixture, adjusting a for each pixel a precise dosage of light projected onto the workpiece using gray-scale control of modulated light intensity to calibrate for non-uniformities in the light. Evaluation of the test mark can be accomplished either manually by a user of the laser processing system or automatically using a scanner or camera integrated into the system.

Thus, embodiments of a MEMS based SLM, and systems using the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

The invention claimed is:

1. A manufacturing system comprising:
a laser;
a work area in which a fixture holding a workpiece to be processed using the laser is positioned;
a spatial light modulator (SLM) including a multi-pixel linear array each pixel comprising one or more microelectromechanical system (MEMS) based diffractors, and each MEMS based diffractor comprising an electrostatically deflectable member coupled to a first light reflective surface and operable to bring light reflected from the first light reflective surface into interference with light reflected from a second light reflective surface in the SLM when the electrostatically deflectable member is deflected by an electrostatic force generated by a driver coupled thereto;
illumination optics operable to illuminate the SLM with light from the laser;
imaging optics operable to focus modulated light from the SLM onto a surface of the workpiece; and
a controller operable to control the laser, the SLM, imaging optics and the fixture to scan the modulated light across the surface of the workpiece,
wherein the controller is further operable to provide analog gray-scale control of an intensity of modulated light reflected from each MEMS based diffractor to provide a precise dosage of light from each pixel onto the surface of the workpiece to compensate for non-uniformities in light illuminating the SLM or in modulated light transmitted therefrom through the imaging optics by controlling an amplitude of a drive signal to the driver coupled thereto, wherein the drive signal is a digital signal and the amplitude resolution of the drive signal is limited only by a bit-depth of the drive signal.

2. The system of claim 1, wherein the imaging optics include optical elements to spatially filter angularly modulated light to provide borderless pixels in images being formed on the surface of the workpiece.

3. The system of claim 2, wherein the electrostatically deflectable members in each MEMS based diffractor comprise low mass and high tension members suspended over a surface of a substrate on which the SLM is formed, and are operable to provide high speed switching between a reflecting and non-reflecting state of less than about 300 ns.

4. The system of claim 3, wherein at least one of the first and second light reflective surfaces comprise a multilayer dielectric mirror, operable to withstand laser powers in pulsed mode greater than 1 millijoule (mJ), and in continuous wave (CW) mode greater than 500 watts (W).

5. The system of claim 3, wherein each of the MEMS based diffractors comprises a number of electrostatically deflectable ribbons suspended over the surface of the substrate, each ribbon having a light reflective surface, and wherein electrostatic deflection of one of the number of electrostatically deflectable ribbons brings light reflected from the first light reflective surface of a first electrostatically deflectable ribbon into interference with light reflected from the second light reflective surface of a second electrostatically deflectable ribbon.

6. The system of claim 3 wherein each of the MEMS based diffractors comprises:
a piston layer suspended over the surface of the substrate by posts at corners thereof, the piston layer including an electrostatically deflectable piston and a number of flexures through which the piston is coupled to the posts;
the first reflective surface over a top surface of the piston; and
a faceplate suspended over the piston layer, the faceplate including the second reflective surface on a top surface of the faceplate, and an aperture through which the piston exposed,
wherein electrostatic deflection of the piston brings light reflected from the first reflective surface into interference with light reflected from the second reflective surface.

7. The system of claim 3, wherein manufacturing system is an additive manufacturing system, the work area comprises a vat of photosensitive material into which the fixture is incrementally lowered by a transport mechanism controlled by the controller to add layers of material to the workpiece as the laser reacts with the photosensitive material as surface of the photosensitive material in the vat.

8. The system of claim 3, wherein manufacturing system is a selective laser sintering (SLS) system, and further comprises a powder layering mechanism to form a layer of sinterable powder over a surface the workpiece to be fused thereto using light from the laser modulated by the SLM.

9. The system of claim 3, wherein manufacturing system is a subtractive manufacturing system operable to remove material from the workpiece by ablation to manufacture an article.

10. A manufacturing method comprising:
using a controller:
generating a light from a laser;
illuminating a spatial light modulator (SLM) comprising a multi-pixel, linear array of MEMS based diffractors, each MEMS based diffractor comprising an electrostatically deflectable member coupled to a first light reflective surface;
modulating light incident on the SLM by deflecting the electrostatically deflectable members of a number of the MEMS based diffractors by applying an electrostatic force generated by a driver coupled thereto, bringing light reflected from the first light reflective surface into interference with light reflected from a second light reflective surface in the SLM;
focusing modulated light from the SLM into a linear swath of modulated light on a surface of a workpiece using imaging optics, the linear swath comprising light from multiple pixels of the SLM; and
controlling the laser, SLM, and imaging optics to scan the linear swath of modulated light across the surface of the workpiece,
wherein the controller is calibrated using a test pattern prior to focusing modulated light on the surface of the workpiece, and is further operable to provide a precise dosage of light from each pixel onto the surface of the workpiece using analog gray-scale control of an intensity of modulated light reflected from each MEMS based diffractor by controlling the electrostatic force generated by the driver coupled thereto to compensate for non-uniformities in light illuminating the SLM or in modulated light transmitted therefrom through the imaging optics.

11. The method of claim 10 further comprising after scanning the linear swath of modulated light a predetermined distance across the surface of the workpiece in a first direction, repositioning the linear swath in a second direction perpendicular to the first direction, and repeating the scanning of the linear swath of modulated light across the surface of the workpiece by the predetermined distance in a third direction parallel and opposite to the first direction.

12. The method of claim 10 wherein controlling the laser, SLM, and imaging optics to record the image comprises scanning the linear swath of modulated light across the surface of the workpiece at least a first time to mark a first number of spots in first locations, and a second time to mark a second number of spots in second locations interleaved with the first locations.

13. A printing system comprising:
- a laser;
- a workpiece having a surface on which an image is to be printed using the laser;
- a spatial light modulator (SLM) including a multi-pixel linear array each pixel comprising one or more microelectromechanical system (MEMS) based diffractors, and each MEMS based diffractor comprising an electrostatically deflectable member coupled to a first light reflective surface and operable to bring light reflected from the first light reflective surface into interference with light reflected from a second light reflective surface in the SLM when the electrostatically deflectable member is deflected by an electrostatic force generated by a driver coupled thereto;
- illumination optics operable to illuminate the SLM with light from the laser;
- imaging optics operable to focus modulated light from the SLM onto a surface of the workpiece; and
- a controller operable to control the laser, the SLM, imaging optics and a fixture on which the workpiece is positioned to scan the modulated light across the surface of the workpiece,
- wherein the controller is further operable to provide analog gray-scale control of an intensity of modulated light reflected from each MEMS based diffractor by controlling the electrostatic force generated by the driver coupled thereto, and
- wherein the electrostatically deflectable members in each MEMS based diffractor comprise low mass and high tension members suspended over a surface of a substrate on which the SLM is formed, and are operable to provide high speed switching between a reflecting and non-reflecting state of less than about 300 ns.

14. The system of claim 13, wherein the controller is operable to provide a precise dosage of light from each pixel onto the surface of the workpiece to compensate for non-uniformities in light illuminating the SLM or in modulated light transmitted therefrom through the imaging optics.

15. The system of claim 14, wherein the imaging optics include optical elements to spatially filter angularly modulated light to provide borderless pixels in images being formed on the surface of the workpiece.

16. The system of claim 13, wherein at least one of the first and second light reflective surfaces comprise a multi-layer dielectric mirror, operable to withstand laser powers in pulsed mode greater than 1 millijoule (mJ), and in continuous wave (CW) mode greater than 500 watts (W).

17. The system of claim 16, wherein the printing system is a Computer-to-Plate (CtP) printing system.

18. The system of claim 16, wherein the printing system is a direct write, maskless lithography system, and the workpiece comprises a substrate used in fabricating microelectromechanical system (MEMS) devices or integrated circuits.

19. The system of claim 1, wherein the drive signals comprise up to a 10-bit resolution, and are capable of being at speeds up to 350 kHz.

* * * * *